(12) United States Patent
Itasaka et al.

(10) Patent No.: US 9,312,812 B2
(45) Date of Patent: Apr. 12, 2016

(54) OSCILLATION CIRCUIT, OSCILLATOR, METHOD OF MANUFACTURING OSCILLATOR, ELECTRONIC DEVICE, AND MOVING OBJECT

(71) Applicant: Seiko Epson Corporation, Tokyo (JP)

(72) Inventors: Yosuke Itasaka, Tatsuno (JP);
Masayuki Ishikawa, Suwa (JP);
Takehiro Yamamoto, Suwa (JP);
Akihiro Fukuzawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/527,006

(22) Filed: Oct. 29, 2014

(65) Prior Publication Data
US 2015/0116043 A1 Apr. 30, 2015

(30) Foreign Application Priority Data

Oct. 30, 2013 (JP) .................................. 2013-225944

(51) Int. Cl.
*H03B 5/36* (2006.01)
(52) U.S. Cl.
CPC ................ *H03B 5/366* (2013.01); *H03B 5/362* (2013.01); *Y10T 29/49007* (2015.01)
(58) Field of Classification Search
CPC ...... H03B 5/12; H03B 5/1203; H03B 5/1206; H03B 5/1228; H03B 5/1231; H03B 5/124; H03B 5/1243; H03B 5/1246; H03B 5/125; H03B 5/1253; H03B 5/1265; H03B 5/30; H03B 5/32; H03B 5/36; H03B 5/362; H03B 5/364; H03B 5/366; H03B 5/368

USPC .... 331/36 C, 116 FE, 116 M, 116 R, 117 FE, 331/117 R, 154, 158, 177 V

See application file for complete search history.

(56) References Cited

U.S. PATENT DOCUMENTS

| | | | |
|---|---|---|---|
| 5,126,695 A | 6/1992 | Abe | |
| 5,369,377 A | 11/1994 | Benhamida | |
| 5,517,109 A | 5/1996 | Albean et al. | |
| 6,617,756 B1 | 9/2003 | Uchiyama | |
| 6,621,362 B2 | 9/2003 | Momtaz et al. | |
| 6,782,485 B2 | 8/2004 | Takai | |
| 6,819,195 B1 | 11/2004 | Blanchard et al. | |
| 7,129,624 B2 | 10/2006 | Umeki et al. | |
| 7,221,234 B2 * | 5/2007 | Chien | ........................ 331/177 V |
| 7,259,638 B2 | 8/2007 | Takahashi | |

(Continued)

FOREIGN PATENT DOCUMENTS

| | | |
|---|---|---|
| JP | 02-261210 | 10/1990 |
| JP | 7-046072 A | 2/1995 |

(Continued)

*Primary Examiner* — Levi Gannon
(74) *Attorney, Agent, or Firm* — Harness, Dickey & Pierce, P.L.C.

(57) ABSTRACT

An oscillation circuit includes a terminal XO which is connected to one end of a resonator, a terminal XI which is connected to the other end of the resonator, an oscillation unit which is electrically connected to the terminal XO and the terminal XI, a control voltage generation circuit, and a switch. The oscillation unit includes a variable capacitive element having one end which is connected to the terminal XO or the terminal XI. The switch controls electrical connection between the other end of the variable capacitive element and an output terminal of the control voltage generation circuit.

13 Claims, 14 Drawing Sheets

(56) References Cited

U.S. PATENT DOCUMENTS

| | | | |
|---|---|---|---|
| 7,463,097 B2 * | 12/2008 | Costa et al. | 331/14 |
| 7,471,164 B2 | 12/2008 | Reimann | |
| 7,646,257 B2 * | 1/2010 | Gailus et al. | 331/177 V |
| 7,714,674 B2 | 5/2010 | Guo et al. | |
| 7,768,357 B2 | 8/2010 | Yamakawa | |
| 7,795,982 B2 | 9/2010 | Yamamoto | |
| 7,821,348 B2 | 10/2010 | Ishimaru et al. | |
| 7,978,016 B2 | 7/2011 | Naito | |
| 8,031,025 B2 * | 10/2011 | Wang et al. | 331/177 V |
| 8,143,961 B2 | 3/2012 | Mastovich | |
| 8,164,159 B1 | 4/2012 | Armstrong et al. | |
| 8,253,506 B2 * | 8/2012 | Liu et al. | 331/177 V |
| 8,368,472 B2 | 2/2013 | Nakamura et al. | |
| 8,461,934 B1 | 6/2013 | Carnu et al. | |
| 2002/0171499 A1 * | 11/2002 | Momtaz et al. | 331/117 FE |
| 2003/0227341 A1 * | 12/2003 | Sawada | 331/177 V |
| 2004/0056725 A1 * | 3/2004 | Kitamura et al. | 331/36 C |
| 2006/0049878 A1 | 3/2006 | Kawabe et al. | |
| 2007/0075798 A1 * | 4/2007 | Amano | 331/167 |
| 2007/0132524 A1 * | 6/2007 | Kishino | 331/179 |
| 2008/0001678 A1 | 1/2008 | Otsuka | |
| 2008/0191756 A1 | 8/2008 | Li et al. | |
| 2009/0039970 A1 * | 2/2009 | Shen et al. | 331/158 |
| 2009/0115542 A1 * | 5/2009 | Nakamura et al. | 331/176 |
| 2009/0256449 A1 | 10/2009 | Nishimura et al. | |
| 2010/0171557 A1 * | 7/2010 | Tsukizawa | 331/17 |
| 2012/0126907 A1 | 5/2012 | Nakamoto et al. | |
| 2012/0176763 A1 | 7/2012 | Asamura | |
| 2013/0154754 A1 | 6/2013 | Frank | |
| 2013/0257553 A1 | 10/2013 | Ishii | |
| 2014/0132362 A1 | 5/2014 | Hsiao | |
| 2014/0210565 A1 | 7/2014 | Vilas Boas et al. | |
| 2015/0116044 A1 | 4/2015 | Itasaka et al. | |
| 2015/0116051 A1 | 4/2015 | Terrovitis | |

FOREIGN PATENT DOCUMENTS

| | | | |
|---|---|---|---|
| JP | 07-249957 | | 9/1995 |
| JP | 11-284484 | A | 10/1999 |
| JP | 2000-278079 | A | 10/2000 |
| JP | 2001-007648 | A | 1/2001 |
| JP | 2001-094347 | A | 4/2001 |
| JP | 2001-102870 | A | 4/2001 |
| JP | 2002-299991 | A | 10/2002 |
| JP | 2004-120293 | A | 4/2004 |
| JP | 2004-214799 | A | 7/2004 |
| JP | 2004-328505 | A | 11/2004 |
| JP | 2005-051513 | A | 2/2005 |
| JP | 2005-203858 | A | 7/2005 |
| JP | 2009-044606 | A | 2/2009 |
| JP | 2009-164691 | A | 7/2009 |
| JP | 2009-201097 | A | 9/2009 |
| JP | 2009-253883 | A | 10/2009 |
| JP | 2010-050508 | A | 3/2010 |
| JP | 2010-062959 | A | 3/2010 |
| JP | 2010-074840 | A | 4/2010 |
| JP | 2013-098678 | A | 5/2013 |
| JP | 2013-207337 | A | 10/2013 |
| JP | 2014-154994 | A | 8/2014 |

* cited by examiner

OSCILLATION CIRCUIT, OSCILLATOR, METHOD OF MANUFACTURING OSCILLATOR, ELECTRONIC DEVICE, AND MOVING OBJECT

BACKGROUND

1. Technical Field

The present invention relates to an oscillation circuit, an oscillator, a method of manufacturing an oscillator, an electronic device, and a moving object.

2. Related Art

In a resonator such as a quartz crystal resonator (piezoelectric resonator) or a micro electro mechanical systems (MEMS) resonator, characteristics of the resonator are inspected by performing an overdrive inspection in which an alternating current (AC) signal of a high current, voltage, or power is applied and the resonator is driven to thereby inspect frequency characteristics of the resonator, a drive level inspection in which a signal obtained by increasing and decreasing an AC signal of a high current, voltage, or power is applied in a stepwise manner and the resonator is driven to thereby inspect the fluctuation of frequency characteristics of the resonator, or the like.

On the other hand, the development has been performed of an oscillator in which a quartz crystal resonator and an oscillation circuit are accommodated in the same accommodation container, in order to achieve a reduction in the size of the oscillator. For this reason, various devices have been performed in order to inspect characteristics of a resonator after the quartz crystal resonator and the oscillation circuit are mounted within the same accommodation container.

JP-A-2009-201097 discloses a quartz crystal oscillator capable of being miniaturized by causing a functional terminal of an oscillator to double as an inspection terminal of a quartz crystal resonator, as compared with a case where an inspection terminal is independently provided.

However, in the quartz crystal oscillator disclosed in JP-A-2009-201097, a high voltage may be applied to both ends of a variable capacitive element embedded in an oscillation circuit, for example, during an overdrive inspection or a drive level inspection, which results in a concern that the variable capacitive element may be damaged. In particular, in an oscillator in which a frequency changes depending on a control voltage, a variable capacitive element may be realized using an MOS having a thin gate oxide film or a small size L in order to increase a voltage sensitivity of a frequency (the amount of change in a frequency with respect to the amount of change in a control voltage). Such a variable capacitive element has a low withstand pressure, and thus there is a higher tendency for the element to be damaged when a high voltage is applied to the both ends thereof. Alternatively, a service time of a product may be decreased. This problem is not limited to the variable capacitive element and similarly occurs also in a capacitive element having a fixed capacitance value or various types of electronic elements such as an inductor.

SUMMARY

An advantage of some aspects of the invention is to provide an oscillation circuit, an oscillator, a method of manufacturing an oscillator, an electronic device, and a moving object which are capable of reducing a concern that an electronic element such as a variable capacitive element may be damaged during an inspection such as an overdrive inspection or a drive level inspection.

The invention can be implemented as the following forms or application examples.

APPLICATION EXAMPLE 1

This application example is directed to an oscillation circuit including a first terminal which is connected to one end of a resonator; a second terminal which is connected to the other end of the resonator; an oscillation unit which is electrically connected to the first terminal and the second terminal; and a first switch. The oscillation unit includes at least one first electronic element having one end which is electrically connected to the first terminal or the second terminal. The first switch controls a voltage which is applied to the other end of the first electronic element.

The oscillation unit may be any of various oscillation circuits such as a Pierce oscillation circuit, an inverter type oscillation circuit, a Colpitts oscillation circuit, or a Hartley oscillation circuit.

For example, the first electronic element may be a variable capacitive element such as a variable capacitive diode, a capacitive element such as a capacitor which has a fixed capacitance value, or any of various types of elements such as an inductor or a resistor.

In the oscillation circuit according to this application example, at least a portion thereof may be constituted by an integrated circuit, and the first electronic element may be formed as a portion of the integrated circuit or may be an external component of the integrated circuit.

According to the oscillation circuit of this application example, it is possible to set the other end of the first electronic element to be in an electrically floating state by controlling a voltage applied to the other end of the first electronic element using the first switch, for example, by controlling a voltage not to be applied to the other end of the first electronic element. For example, when an overdrive inspection or a drive level inspection of the resonator is performed in a state where the other end of the first electronic element is electrically floated, a state is set in which a high voltage is not likely to be applied to the both ends of the first electronic element. Therefore, it is possible to reduce a concern that the first electronic element may be damaged.

APPLICATION EXAMPLE 2

In the oscillation circuit according to the application example described above, the oscillation circuit may further include a first voltage generation circuit, and the first switch may control electrical connection between the other end of the first electronic element and an output terminal of the first voltage generation circuit.

According to the oscillation circuit of this application example, for example, the electrical connection between the other end of the first electronic element and the output terminal of the first voltage generation circuit is blocked using the first switch, and thus the other end of the first electronic element can be set to be in an electrically floating state. For example, when an overdrive inspection or a drive level inspection of the resonator is performed in a state where the other end of the first electronic element is electrically floated, a state is set where a high voltage is not likely to be applied to both ends of the first electronic element. Therefore, it is possible to reduce a concern that the first electronic element may be damaged.

APPLICATION EXAMPLE 3

In the oscillation circuit according to the application example described above, the first electronic element may be a variable capacitive element.

According to the oscillation circuit of this application example, the electrical connection between the other end of the first electronic element, which is a variable capacitive element, and the output terminal of the first voltage generation circuit is blocked using the first switch, and thus the other end of the first electronic element is set to be in an electrically floating state. Accordingly, a potential difference between both ends of the first electronic element is further reduced, as compared with a case where the other end of the first electronic element and the output terminal of the first voltage generation circuit are in an electrically connected state. Therefore, it is possible to reduce a concern that the first electronic element may be damaged, for example, during an overdrive inspection or a drive level inspection of the resonator.

In addition, according to the oscillation circuit of this application example, the other end of the first electronic element, which is a variable capacitive element, is electrically connected to the output terminal of the first voltage generation circuit using, for example, the first switch. Thus, it is possible to change a capacitance value of the first electronic element in accordance with a voltage generated by the first voltage generation circuit. Therefore, the oscillation circuit according to this application example can control a frequency to be variable in accordance with a voltage generated by the first voltage generation circuit.

APPLICATION EXAMPLE 4

In the oscillation circuit according to the application example described above, the oscillation circuit may further include a second voltage generation circuit and a second switch, the oscillation unit may further include at least one second electronic element having one end which is electrically connected to the first terminal or the second terminal, and the second switch may control electrical connection between the other end of the second electronic element and an output terminal of the second voltage generation circuit.

According to the oscillation circuit of this application example, the electrical connection between the other end of the second electronic element and the output terminal of the second voltage generation circuit is blocked using the second switch, and thus the other end of the second electronic element can be set to be in an electrically floating state. For example, when an overdrive inspection or a drive level inspection of the resonator is performed in a state where the other end of the second electronic element is electrically floated, a state is set where a high voltage is not likely to be applied to the both ends of the second electronic element. Therefore, it is possible to reduce a concern that the second electronic element may be damaged.

APPLICATION EXAMPLE 5

In the oscillation circuit according to the application example described above, the second electronic element may be a variable capacitive element.

According to the oscillation circuit of this application example, the electrical connection between the other end of the second electronic element, which is a variable capacitive element, and the output terminal of the second voltage generation circuit is blocked using the second switch, and thus the other end of the second electronic element is set to be in an electrically floating state. Accordingly, a potential difference between both ends of the second electronic element is further reduced, as compared with a case where the other end of the second electronic element and the output terminal of the second voltage generation circuit are in an electrically connected state. Therefore, it is possible to reduce a concern that the second electronic element may be damaged, for example, during an overdrive inspection or a drive level inspection of the resonator.

In addition, according to the oscillation circuit of this application example, the other end of the second electronic element, which is a variable capacitive element, is electrically connected to the output terminal of the second voltage generation circuit using, for example, the second switch. Thus, it is possible to change a capacitance value of the second electronic element in accordance with a voltage generated by the second voltage generation circuit. Therefore, the oscillation circuit according to this application example can control a frequency to be variable in accordance with a voltage generated by the second voltage generation circuit.

APPLICATION EXAMPLE 6

In the oscillation circuit according to the application example described above, the oscillation unit may include a capacitive element having one end, which is electrically connected to the other end of the first electronic element, and the other end which is grounded.

APPLICATION EXAMPLE 7

The oscillation circuit according to the application example described above may further include a third terminal which is grounded; a fourth terminal which is electrically connected to the second terminal; and a first switching unit which electrically connects the first terminal to the third terminal under control of a switching signal.

According to the oscillation circuit of this application example, a voltage signal for inspecting the resonator is supplied between the fourth terminal and the third terminal, and thus it is possible to perform an inspection of characteristics of the resonator such as an overdrive inspection or a drive level inspection. In addition, the third terminal can be shared during a normal operation of the oscillation circuit and during an inspection of the resonator, and thus it is possible to reduce the number of terminals used for the inspection, as compared with a case where an inspection terminal exclusively for inspection is provided. Therefore, for example, it is possible to reduce the possibility of the occurrence of an inspection failure due to a defective electrical connection between a probe for inputting an inspection signal and a terminal on the oscillation circuit side, and thus it is possible to realize the oscillation circuit in which the reliability of the inspection of the resonator is increased.

In addition, it is possible to supply a voltage signal for an inspection to the resonator through the third terminal and the fourth terminal without using an oscillation unit, and thus the restrictions on the magnitude of a voltage signal are reduced, as compared with a case where a voltage signal for an inspection is applied to the resonator through the oscillation unit.

APPLICATION EXAMPLE 8

The oscillation circuit according to the application example described above may further include a second switching unit which electrically connects the second terminal to the fourth terminal under control of the switching signal.

According to the oscillation circuit of this application example, the fourth terminal can be used as a functional terminal (for example, an input terminal of a control signal for controlling an oscillation frequency) during a normal operation of the oscillation circuit, as an inspection terminal during the inspection of the resonator, and thus it is possible to reduce the number of terminals used for the inspection, as compared with a case where an inspection terminal exclusively for inspection is provided. Therefore, for example, it is possible to reduce the possibility of the occurrence of an inspection failure due to a defective electrical connection between a probe for inputting an inspection signal and a terminal on the oscillation circuit side, and thus it is possible to realize the oscillation circuit in which the reliability of the inspection of the resonator is increased.

APPLICATION EXAMPLE 9

In the oscillation circuit according to the application example described above, the first terminal may be connected to the input terminal side of the oscillation unit.

APPLICATION EXAMPLE 10

In the oscillation circuit according to the application example described above, the oscillation circuit may have a first mode in which the first switch electrically connects the other end of the first electronic element to the output terminal of the first voltage generation circuit and a second mode in which the first switch blocks electrical connection between the other end of the first electronic element and the output terminal of the first voltage generation circuit, and switching between the first mode and the second mode may be performed on the basis of a clock signal which is input during a period in which a power supply voltage to be supplied is equal to or greater than a reference value.

According to the oscillation circuit of this application example, switching between modes is performed on the basis of the size of a power supply voltage and two clock signals. Accordingly, the switching between the modes is not performed only by the fluctuation of the power supply voltage, and thus it is possible to reduce the possibility of malfunction in which the switching between the modes is unintentionally performed.

APPLICATION EXAMPLE 11

This application example is directed to an oscillator including any of the oscillation circuits described above and a resonator.

APPLICATION EXAMPLE 12

The oscillator according to the application example described above may further include a package that accommodates the oscillation circuit and the resonator.

According to these application examples, it is possible to reduce a concern that the first electronic element may be damaged during an inspection of the resonator, and thus it is possible to realize the oscillator with higher reliability.

APPLICATION EXAMPLE 13

This application example is directed to a method of manufacturing an oscillator. The method includes preparing an oscillation circuit and a resonator, the oscillation circuit including a first terminal, a second terminal, an oscillation unit which is electrically connected to the first terminal and the second terminal, a first voltage generation circuit, and a first switch, the oscillation unit including at least one first electronic element having one end being electrically connected to the first terminal or the second terminal, and the first switch controlling electrical connection between the other end of the first electronic element and an output terminal of the first voltage generation circuit; electrically connecting the first terminal to one end of the resonator, and electrically connecting the second terminal to the other end of the resonator; setting the oscillation circuit to be in a second mode in which the first switch blocks electrical connection between the other end of the first electronic element and the output terminal of the first voltage generation circuit; inspecting characteristics of the resonator in a state where the oscillation circuit is set to be in the second mode; and setting the oscillation circuit to be in the first mode in which the first switch electrically connects the other end of the first electronic element to the output terminal of the first voltage generation circuit.

According to the method of manufacturing an oscillator of this application example, the electrical connection between the other end of the first electronic element and the output terminal of the first voltage generation circuit is blocked using the first switch. Accordingly, it is possible to inspect characteristics of the resonator in a state where the other end of the first electronic element is electrically floated, that is, in a state where a high voltage is not likely to be applied to the both ends of the first electronic element, and thus it is possible to reduce a concern that the first electronic element may be damaged. Therefore, it is possible to manufacture the oscillator with higher reliability by using the method of manufacturing an oscillator according to this application example.

APPLICATION EXAMPLE 14

In the method of manufacturing an oscillator according to the application example described above, the inspecting of the characteristics of the resonator may include applying at least one of a signal for an overdrive inspection and a signal for a drive level inspection to the resonator.

According to the method of manufacturing an oscillator according to this application example, at least one of an overdrive inspection and a drive level inspection is performed as an inspection of the resonator, and thus it is possible to confirm that an oscillator, which was determined to be a non-defective product in the inspection of the resonator, is a non-defective product. Therefore, it is possible to manufacture the oscillator with high reliability.

APPLICATION EXAMPLE 15

This application example is directed to an electronic device including any of the oscillation circuits described above or any of the oscillators described above.

APPLICATION EXAMPLE 16

This application example is directed to a moving object including any of the oscillation circuits described above or any of the oscillators described above.

According to the electronic device and the moving object of these application examples, it is possible to reduce a concern that the first electronic element may be damaged during an inspection of the resonator, and thus it is possible to realize the electronic device and moving object with higher reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the accompanying drawings. Meanwhile, the embodiments described below do not unduly limit the aspects of the invention described in the appended claims. In addition, all of the configurations described below are not necessarily essential components of the invention.

1. Oscillator

1-1. First Embodiment

Figure 1:
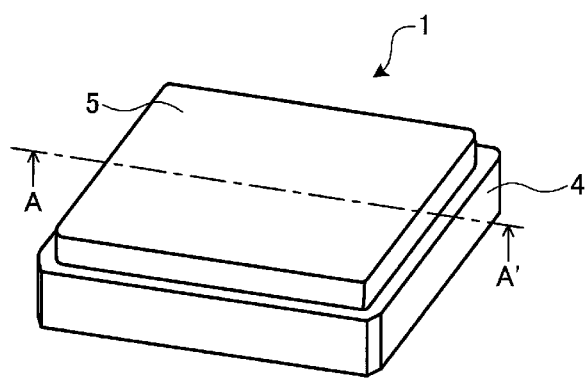
FIG. 1 is a perspective view of an oscillator according to this embodiment.
Figure 2A:
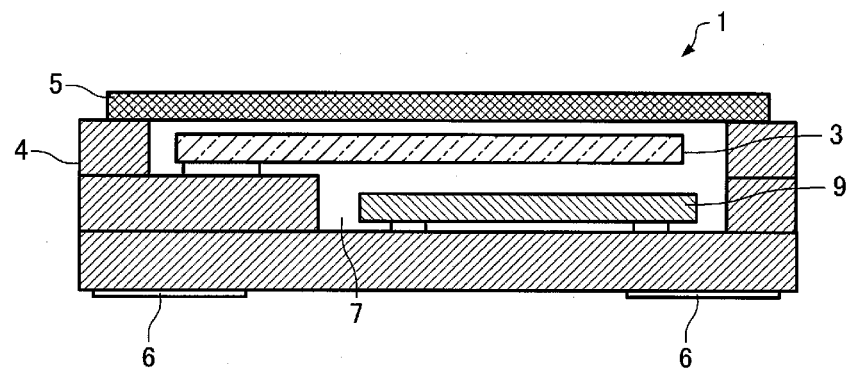
FIG. 2A is a cross-sectional view of an oscillator.
Figure 2B:
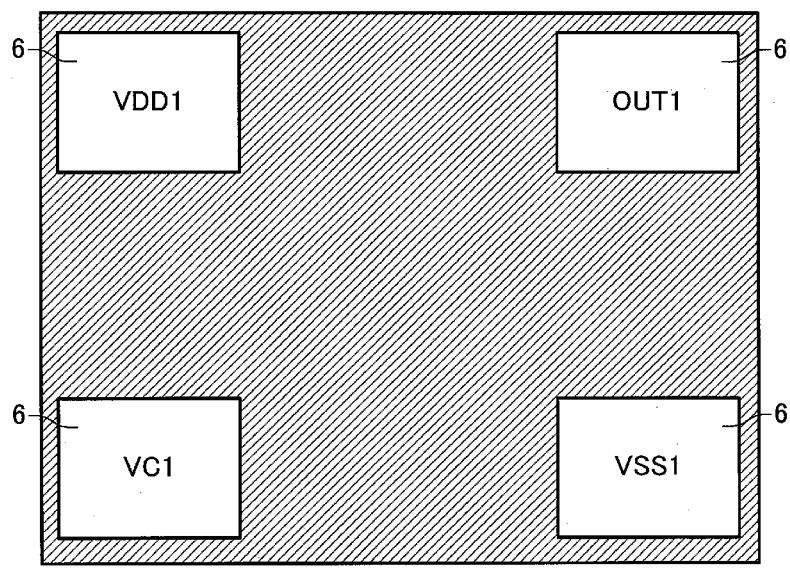
FIG. 2B is a bottom view of the oscillator.

FIG. 1 and FIGS. 2A and 2B show a structure of an oscillator according to this embodiment. FIG. 1 is a perspective view of the oscillator according to this embodiment. FIG. 2A is a cross-sectional view taken along line A-A' of FIG. 1, and FIG. 2B is a bottom view of the oscillator according to this embodiment.

As shown in FIGS. 1 and 2A, an oscillator 1 according to this embodiment is configured to include an electronic component 9, a resonator 3, a package 4, a lid 5, and an external terminal (external electrode) 6 which constitute an oscillation circuit 2.

For example, a surface acoustic wave (SAW) resonator, an AT cut quartz crystal resonator, an SC cut quartz crystal resonator, a tuning fork type quartz crystal resonator, a piezoelectric resonator, a micro electro mechanical systems (MEMS) resonator, and the like can be used as the resonator 3. As a substrate material of the resonator 3, a piezoelectric material which is a single piezoelectric crystal such as quartz crystal, lithium tantalate, or lithium niobate, or piezoelectric ceramics such as lead zirconate titanate, or a silicon semiconductor material can be used. As excitation means of the resonator 3, excitation means using a piezoelectric effect may be used, or electrostatic driving using a Coulomb force may be used.

In the package 4, the electronic component 9 and the resonator 3 are accommodated within the same space. Specifically, a concave portion is provided in the package 4 and serves as an accommodation chamber 7 by the lid 5 being covered thereon. The inside of the package 4 or the surface of the concave portion is provided with wiring, which is not shown in the drawing, for electrically connecting two terminals (a terminal XO and a terminal XI of FIG. 3 to be described later) of the oscillation circuit 2 to two terminals of the resonator 3, respectively. In addition, the inside of the package 4 or the surface of the concave portion is provided with wiring, which is not shown in the drawing, for electrically connecting the terminals of the oscillation circuit 2 to the corresponding external terminals 6, respectively.

As shown in FIG. 2B, the bottom of the oscillator 1 (rear surface of the package 4) according to this embodiment is provided with four external terminals 6, that is, an external terminal VDD1 which is a power terminal, an external terminal VSS1 which is a ground terminal, an external terminal VC1 which is a control terminal, and an external terminal OUT1 which is an output terminal. A power supply voltage is supplied to the external terminal VDD1, and the external terminal VSS1 is grounded. A signal for controlling a frequency is input to the external terminal VC1, and an oscillation signal having a frequency being controlled is output from the external terminal OUT1.

Figure 3:
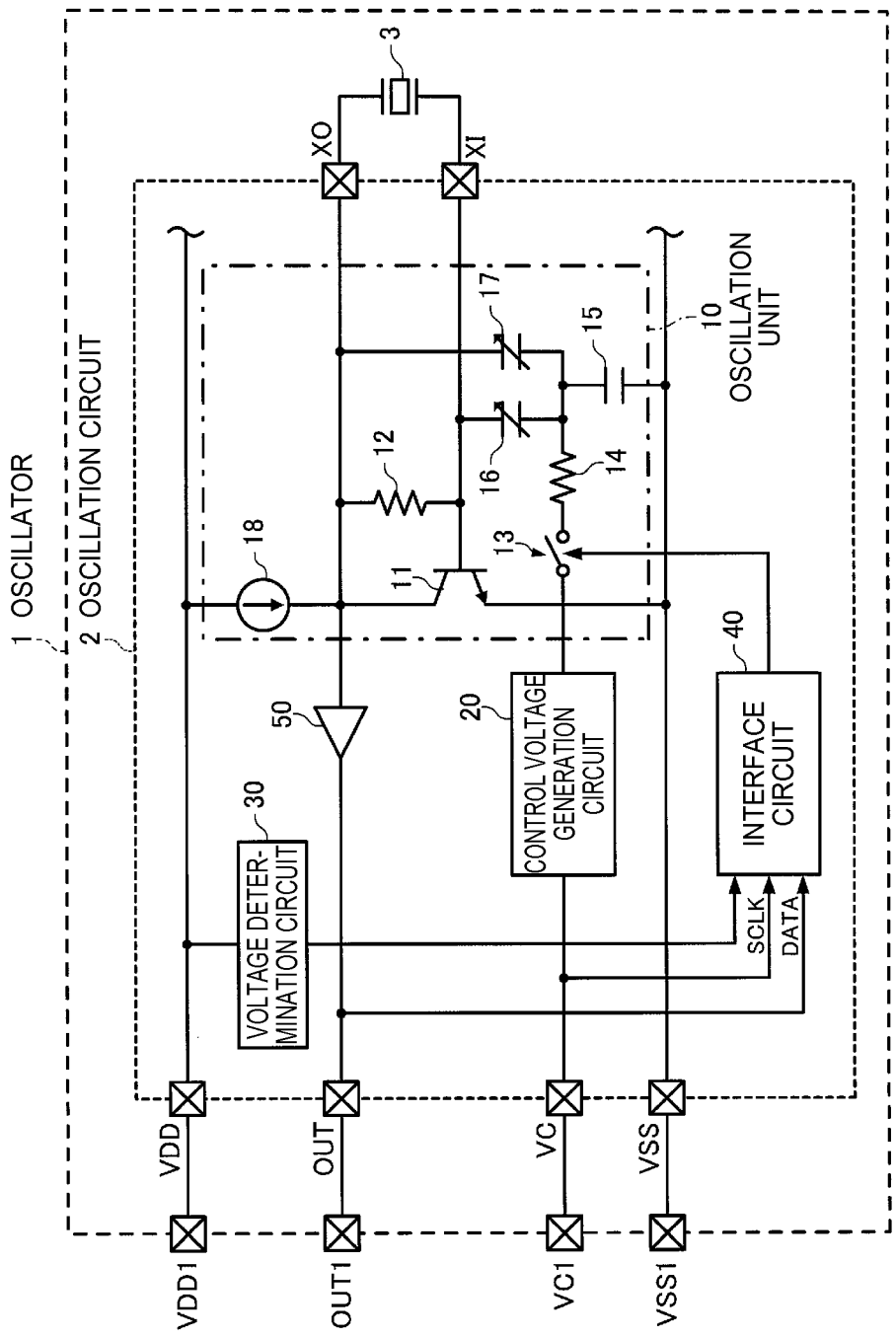
FIG. 3 is a functional block diagram of an oscillator according to a first embodiment.

FIG. 3 is a functional block diagram of the oscillator 1 according to the first embodiment. As shown in FIG. 3, the oscillator 1 includes the oscillation circuit 2 and the resonator 3. The oscillation circuit 2 includes six terminals VDD, VSS, VC, OUT, XO, and XI which are exposed to the surface of the electronic component 9 which is, for example, an IC chip. The four terminals VDD, VSS, VC, and OUT are connected to the external terminals VDD1, VSS1, VC1, and OUT1 of the package 4, respectively. In addition, the terminal XI (example of a first terminal) is connected to one end (one terminal) of the resonator 3, and the terminal XO (example of a second terminal) is connected to the other end (the other terminal) of the resonator 3.

In this embodiment, the oscillation circuit 2 includes an oscillation unit 10, a control voltage generation circuit 20, a voltage determination circuit 30, an interface circuit 40, and an output buffer 50. Meanwhile, the oscillation circuit 2 according to this embodiment may be configured such that some of the components are omitted or changed or other components are added thereto.

The oscillation unit 10 is connected to the terminal XO and the terminal XI and oscillates the resonator 3. The terminal XI is connected to an input terminal side of the oscillation unit 10, and the terminal XO is connected to an output terminal side of the oscillation unit 10.

In this embodiment, the oscillation unit 10 includes an NPN-type bipolar transistor 11, a resistance element 12, a switch 13, a resistance element 14, a capacitive element 15, a variable capacitive element 16, a variable capacitive element 17, and a constant current source 18. Meanwhile, the oscillation unit 10 according to this embodiment may be configured such that some of the components are omitted or changed or other components are added thereto.

The constant current source 18 supplies a constant current between a collector terminal and an emitter terminal of the bipolar transistor 11 from the terminal VDD.

In the NPN-type bipolar transistor 11, for example, a base terminal is connected to the terminal XI so that a signal from the terminal XI is supplied to the base terminal. For example, a collector terminal is connected to the terminal XO so that a signal from the collector terminal is supplied to the terminal XO. An emitter terminal is electrically connected to the terminal VSS.

The resistance element 12 is connected between the terminal XO and the terminal XI. For example, one end (one terminal) of the resistance element is connected to the terminal XO and the other end (the other terminal) thereof is connected to the terminal XI.

In the variable capacitive element 16 (example of a first electronic element), for example, one end (one terminal) thereof is electrically connected to the terminal XI and the other end (the other terminal) thereof is electrically connected to one end (one terminal) of the capacitive element 15 so that a signal from the terminal XI is supplied to the capacitive element 15 through the variable capacitive element 16. In the variable capacitive element 17 (example of a first electronic element), for example, one end (one terminal) thereof is electrically connected to the terminal XO and the other end (the other terminal) thereof is electrically connected to one end of the capacitive element 15 so that a signal from the terminal XI is supplied to the capacitive element 15 through the variable capacitive element 17. The variable capacitive element 16 and the variable capacitive element 17 are capable of controlling the respective capacitances thereof by controlling voltage. A varactor (also referred to as a variable capacitive diode) or the like can be used as the element.

In the capacitive element 15, one end (one terminal) thereof is electrically connected to the other end of the variable capacitive element 16 and the other end of the variable capacitive element 17, and the other end (the other terminal) thereof is electrically connected to the terminal VSS.

The switch 13 (example of a first switch) is connected between the control voltage generation circuit 20, and the other end of the variable capacitive element 16 and the other end of the variable capacitive element 17 so as to be capable of limiting the magnitude of a DC signal which is supplied to the variable capacitive element 16 and the variable capacitive element 17 from the control voltage generation circuit 20. For example, one end (one terminal) of the switch 13 is connected to an output terminal of the control voltage generation circuit 20, and the other end (the other terminal) thereof is connected to one end (one terminal) of the resistance element 14. The other end (the other terminal) of the resistance element 14 is connected to the other end of the variable capacitive element 16 and the other end of the variable capacitive element 17. The switch 13 controls the electrical connection of the output terminal of the control voltage generation circuit 20 to the other end of the variable capacitive element 16 and the other end of the variable capacitive element 17. That is, the switch 13 controls a voltage applied to the other end of the variable capacitive element 16 and the other end of the variable capacitive element 17. The switch 13 may be provided outside the oscillation unit 10.

In the oscillation unit 10 configured in such a manner, the bipolar transistor 11 amplifies an output signal of the resonator 3 which is input from the terminal XI, and functions as an amplification element that supplies the amplified signal as an input signal of the resonator 3 through the terminal XO. Meanwhile, the amplification element included in the oscillation unit 10 may be a PNP-type bipolar transistor, a field effect transistor (FET), a metal oxide semiconductor field effect transistor (MOSFET), a thyristor, or the like.

The control voltage generation circuit 20 (example of a first voltage generation circuit) generates a control voltage in response to a control signal which is input from a terminal VC. Such a control voltage generation circuit 20 includes, for example, an automatic frequency control (AFC) circuit that generates a control voltage for adjusting a frequency under typical conditions and a temperature compensation circuit that generates a compensation voltage, inclusive of the oscillation circuit 2 and the resonator 3, for compensating for frequency temperature characteristics in response to an output signal of an external temperature sensor.

Meanwhile, the control voltage generation circuit 20 may be configured to generate a control voltage in response to an internal signal of the oscillation circuit 2. For example, a temperature sensor is embedded in the oscillation circuit 2, and the control voltage generation circuit 20 may be a temperature compensation circuit that generates a control voltage in response to an output signal of the embedded temperature sensor.

The voltage determination circuit 30 determines whether a voltage of the terminal VDD is higher or lower than a threshold value. In this embodiment, the voltage determination circuit 30 outputs a signal which is set to be at a high level when the voltage of the terminal VDD is higher than the threshold value and which is set to be at a low level when the voltage of the terminal VDD is lower than the threshold value. The voltage determination circuit 30 can be realized using a comparator.

When the output signal of the voltage determination circuit 30 is at a high level, the interface circuit 40 receives a serial clock signal SCLK input from the external terminal VC1 and a serial data signal DATA input from the external terminal OUT1, and reads and writes data with respect to an internal register or an internal memory which is not shown in the drawing.

In the output buffer 50, the input terminal is connected to the collector terminal of the bipolar transistor 11 and the output terminal is connected to the terminal OUT, and thus an oscillation signal output from the oscillation unit 10 is input to the output buffer and is output to the terminal OUT. The output buffer 50 may output a signal having the same polarity as that of the input signal or may output a signal having an opposite polarity to that of the input signal. The output buffer 50 can be realized using, for example, one CMOS inverter, or can be realized using a circuit in which a plurality of CMOS inverters are connected to each other in series.

Figure 4:
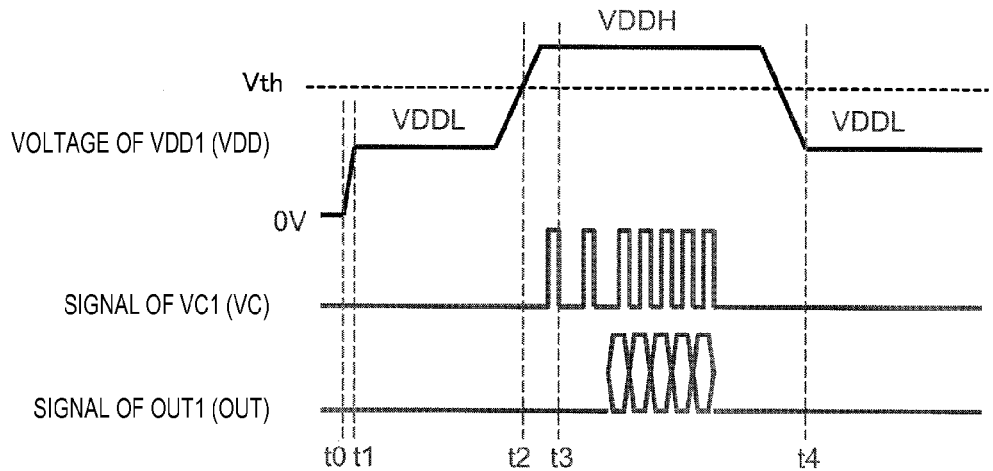
FIG. 4 is a timing chart illustrating a mode switching operation.

In this embodiment, the oscillation circuit 2 is configured to be switched from a normal mode to a test mode through the interface circuit 40. FIG. 4 is a timing chart illustrating a mode switching operation. A horizontal axis of FIG. 4 corresponds to time, and a vertical axis thereof corresponds to voltage. The timing chart of FIG. 4 shows a voltage of the external terminal VDD1 (terminal VDD of the oscillation circuit 2), the serial clock signal SCLK input from the external terminal VC1 (terminal VC of the oscillation circuit 2), and the serial data signal DATA input from the external terminal OUT1 (terminal OUT of the oscillation circuit 2).

In the example shown in FIG. 4, the voltage of the external terminal VDD1 changes to 0 V at time t0, changes to a voltage VDDL at time t1, and changes to a reference value Vth at time t2, and then rises to a voltage VDDH. Serial communication is enabled at time t3 which is a falling time of a first pulse of the serial clock signal SCLK input during a period in which the voltage of the external terminal VDD1 is VDDH. The subsequent pulse of the serial clock signal SCLK is a pulse for setting a test mode, and the type of test mode is selected in response to the serial data signal DATA of 5 bits which is input in synchronization with the subsequent five pulses. The mode transitions to the test mode selected at time t4 when the voltage of the external terminal VDD1 returns to VDDL. The serial data signal DATA of 5 bits is set to a predetermined value, and thus the oscillation circuit 2 can be set to be in an overdrive mode by setting.

As described above, in this embodiment, transition to the test mode is not performed as long as the serial clock signal SCLK is not input from the external terminal VC1 when the voltage of the external terminal VDD1 is equal to or greater than a reference value Vth, and thus the mode is not switched only by the fluctuation of the voltage of the external terminal VDD1. Therefore, it is possible to reduce the possibility of malfunction in which switching from a normal mode to a test mode is performed due to the influence of noise and the like.

In this embodiment, when the oscillation circuit 2 is set to be in a normal mode (example of a first mode), the switch 13 is closed, and the other end of the variable capacitive element 16 and the other end of the variable capacitive element 17 are electrically connected to the output terminal of the control voltage generation circuit 20. On the other hand, when the oscillation circuit 2 is set to be in an overdrive mode (example of a second mode), the switch 13 is opened, and the connection of the output terminal of the control voltage generation circuit 20 to the other end of the variable capacitive element 16 and the other end of the variable capacitive element 17 is blocked.

In the oscillation circuit 2, a current supplied from the constant current source 18 becomes larger than at the time of setting a normal mode, in the overdrive mode. Thus, the resonator 3 is strongly excited using an alternating current (AC) signal. That is, in the oscillator 1, the oscillation circuit 2 is set to be in an overdrive mode, and thus the oscillator is configured to be capable of performing an overdrive inspection in which foreign substances on an electrode of the resonator 3 are removed by strongly exciting (overdriving) the resonator 3 using an AC signal.

Meanwhile, in this embodiment, the oscillation circuit 2 is realized as an IC with one chip. However, the oscillation circuit may be realized as an IC with a plurality of chips, or a portion or entirety thereof may be realized using a discreet component. For example, the variable capacitive elements 16 and 17 may be external components of the IC.

Figure 5:
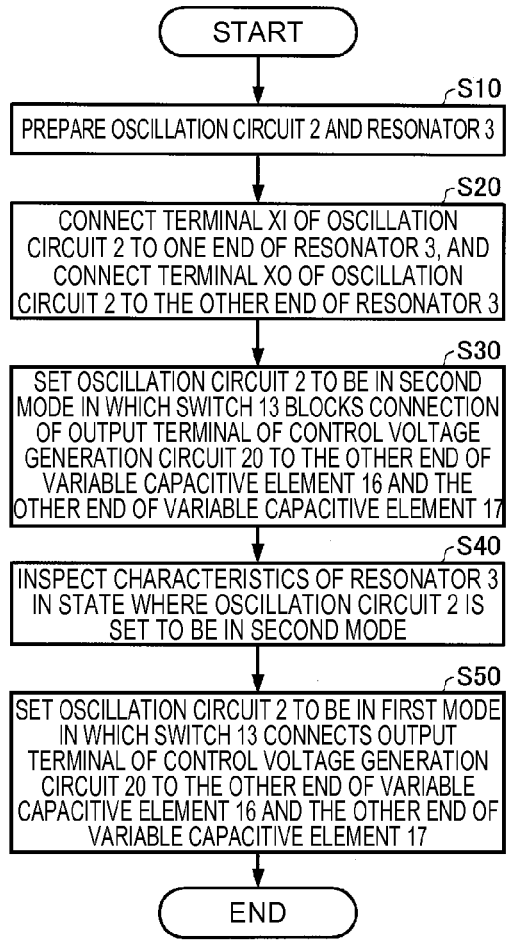
FIG. 5 is a flow chart showing an example of a method of manufacturing an oscillator according to this embodiment.

FIG. 5 is a flow chart showing an example of a method of manufacturing the oscillator 1 according to this embodiment. Meanwhile, the flow chart of FIG. 5 may describe a portion of a process of manufacturing the oscillator 1 or may include other processes not shown in the drawing.

As shown in FIG. 5, in this embodiment, first, the oscillation circuit 2 and the resonator 3 are prepared (process S10). The terminal XI of the oscillation circuit 2 is connected to one end of the resonator 3, and the terminal XO of the oscillation circuit 2 is connected to the other end of the resonator 3 (process S20).

Next, the oscillation circuit 2 is set to be in the second mode in which the switch 13 blocks the electrical connection of the output terminal of the control voltage generation circuit 20 to the other end of the variable capacitive element 16 and the other end of the variable capacitive element 17 (process S30). The second mode may be an overdrive mode or may be another test mode.

Next, characteristics of the resonator 3 are inspected in a state where the oscillation circuit 2 is set to be in the second mode (process S40). The inspection performed in process S40 is an inspection corresponding to the second mode. For example, when the second mode is an overdrive mode, an overdrive inspection is performed.

Next, the switch 13 sets the oscillation circuit 2 to be in the first mode in which the other end of the variable capacitive element 16 and the other end of the variable capacitive element 17 are electrically connected to the output terminal of the control voltage generation circuit 20 (process S50). The second mode may be a normal mode or may be a test mode. For example, a configuration may be adopted in which the external terminal VDD1 (terminal VDD) is set to a ground potential (0 V) and is then set to VDDL so that the external terminal is initialized to the first mode, or a configuration may be adopted in which the external terminal can be set to be in the first mode through the interface circuit 40.

As described above, according to the oscillator of the first embodiment, when the oscillation circuit 2 is set to be in a normal mode (when the switch 13 is closed), the control voltage generated by the control voltage generation circuit 20 is applied to the other end of the variable capacitive element 16 and the other end of the variable capacitive element through the resistance element 14, and the variable capacitive elements 16 and 17 are set to have a capacitance value based on the control voltage. An oscillation frequency of the resonator 3 changes in accordance with the capacitance values of the variable capacitive elements 16 and 17. That is, when the oscillation circuit 2 is set to be in a normal mode, the oscillator 1 functions as a frequency-controlled oscillator.

On the other hand, when the oscillation circuit 2 is set to be in an overdrive mode (when the switch 13 is opened), the control voltage generated by the control voltage generation circuit 20 is not applied to the other end of the variable capacitive element 16 or the other end of the variable capacitive element 17, and the other end of the variable capacitive element 16 and the other end of the variable capacitive element 17 are in an electrically floating state. Since the switch 13 is opened in the overdrive mode, the capacitance of a node (hereinafter, referred to as "node A"), to which the other end of the variable capacitive element 16 and the other end of the variable capacitive element 17 are connected, to the ground is composed of only a value of the capacitive element 15 and becomes smaller than that in a normal mode in which the switch 13 is closed. Accordingly, impedance between the node A and the ground (earth) becomes higher in the overdrive mode, and thus a fluctuation in the voltage of one end of the variable capacitive element 16 and a fluctuation in the voltage of one end of the variable capacitive element 17 are likely to be transmitted to the node A. As a result, even when the resonator 3 is strongly excited during an overdrive inspection, a potential difference between both ends of the variable capacitive element 16 and a potential difference between both ends of the variable capacitive element 17 can be reduced. Thus, it is possible to reduce a concern that the variable capacitive elements 16 and 17 may be damaged in spite of their relatively low withstand pressure. Therefore, according to this embodiment, it is possible to realize the oscillator with higher reliability.

1-2. Second Embodiment

Figure 6:
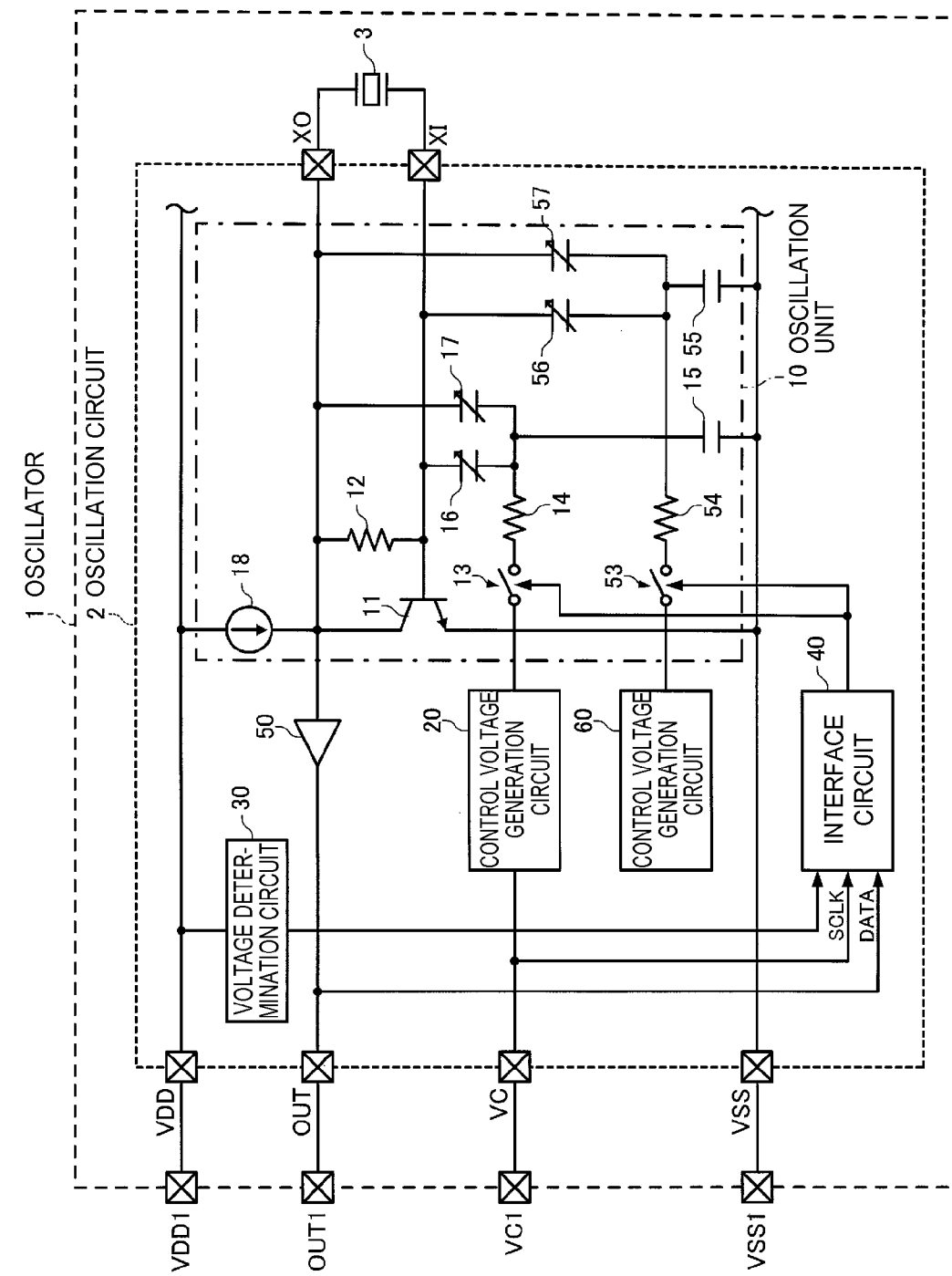
FIG. 6 is a functional block diagram of an oscillator according to a second embodiment.

FIG. 6 is a functional block diagram of an oscillator according to a second embodiment. In FIG. 6, components corresponding to the respective components of FIG. 3 are denoted by the same reference numerals and signs as those in FIG. 3. As shown in FIG. 6, an oscillation circuit 2 in an oscillator 1 according to the second embodiment is further provided with a control voltage generation circuit 60 with respect to the first embodiment. In the oscillation circuit 2 in the oscillator 1 according to the second embodiment, a switch 53, a resistance element 54, a capacitive element 55, a variable capacitive element 56, and a variable capacitive element 57 are further added to an oscillation unit 10 with respect to the first embodiment.

One end (one terminal) of the variable capacitive element 56 (example of a second electronic element) is electrically connected to a terminal XI, and the other end (the other terminal) thereof is electrically connected to one end (one terminal) of the capacitive element 55. One end (one terminal) of the variable capacitive element 57 (example of a second electronic element) is electrically connected to a terminal XO, and the other end (the other terminal) thereof is electrically connected to one end of the capacitive element 55. The variable capacitive element 56 and the variable capacitive element 57 are elements capable of controlling the capacitance thereof by controlling a voltage. A varactor (also referred to as a variable capacitive diode) or the like can be used as the elements.

One end of the capacitive element 55 is electrically connected to the other end of the variable capacitive element 56, and the other end thereof is electrically connected to a terminal VSS.

The switch 53 (example of a second switch) is connected between the control voltage generation circuit 60, and the other end of the variable capacitive element 56 and the other end of the variable capacitive element 57 so as to be capable of limiting the magnitude of a DC signal which is supplied to the variable capacitive element 56 and the variable capacitive element 57 from the control voltage generation circuit 60. For example, one end (one terminal) of the switch is connected to an output terminal of the control voltage generation circuit 60, and the other end (the other terminal) thereof is connected to one end of the resistance element 54. The other end of the resistance element 54 is connected to the other end of the variable capacitive element 56 and the other end of the variable capacitive element 57. The switch 53 controls the electrical connection of the output terminal of the control voltage generation circuit 60 to the other end of the variable capacitive element 56 and the other end of the variable capacitive element 57. The switch 53 may be provided outside the oscillation unit 10.

The control voltage generation circuit 60 (example of a second voltage generation circuit) generates a control voltage in response to an internal signal of the oscillation circuit 2. Such a control voltage generation circuit 60 includes, for example, a temperature compensation circuit that generates a compensation voltage, inclusive of the oscillation circuit 2 and the resonator 3, for compensating for frequency temperature characteristics in response to an output signal of a temperature sensor embedded in the oscillation circuit 2.

Meanwhile, the control voltage generation circuit 60 may be configured to generate a control voltage in response to a control signal which is input from the outside.

In this embodiment, when the oscillation circuit 2 is set to be in a normal mode (example of a first mode), the switch 13 is closed, and the other end of the variable capacitive element 16 and the other end of the variable capacitive element 17 are electrically connected to the output terminal of the control voltage generation circuit 20. In addition, the switch 53 is closed, and the other end of the variable capacitive element 56 and the other end of the variable capacitive element 57 are electrically connected to the output terminal of the control voltage generation circuit 60. On the other hand, when the oscillation circuit 2 is set to be in an overdrive mode (example of a second mode), the switch 13 is opened, and the electrical connection of the output terminal of the control voltage generation circuit 20 to the other end of the variable capacitive element 16 and the other end of the variable capacitive element 17 is blocked. In addition, the switch 53 is opened, and the electrical connection of the output terminal of the control voltage generation circuit 60 to the other end of the variable capacitive element 56 and the other end of the variable capacitive element 57 is blocked.

The other configurations of the oscillator 1 according to the second embodiment are the same as those in the first embodiment, and thus the description thereof will be omitted here. In addition, a perspective view, a cross-sectional view, a bottom view, and a manufacturing method of the oscillator 1 according to the second embodiment are the same as those in the first embodiment, and thus the illustration and description thereof will be omitted here.

According to the oscillator of the second embodiment, when the oscillation circuit 2 is set to be in a normal mode (when both the switch 13 and the switch 53 are closed), the control voltage generated by the control voltage generation circuit 20 is applied to the other end of the variable capacitive element 16 and the other end of the variable capacitive element 17 through a resistance element 14, and the variable capacitive elements 16 and 17 are set to have a capacitance value based on the control voltage. In addition, the control voltage generated by the control voltage generation circuit 60 is applied to the other end of the variable capacitive element 56 and the other end of the variable capacitive element 57 through the resistance element 54, and the variable capacitive elements 56 and 57 are set to have a capacitance value based on the control voltage. An oscillation frequency of the resonator 3 changes in accordance with the capacitance values of the variable capacitive elements 16 and 17 and the capacitance values of the variable capacitive elements 56 and 57. That is, when the oscillation circuit 2 is set to be in a normal mode, the oscillator 1 functions as a frequency-controlled oscillator.

On the other hand, when the oscillation circuit 2 is set to be in an overdrive mode (when the switch 13 and the switch 53 are opened), the control voltage generated by the control voltage generation circuit 20 is not applied to the other end of the variable capacitive element 16 or the other end of the variable capacitive element 17, and the other end of the variable capacitive element 16 and the other end of the variable capacitive element 17 are in an electrically floating state. In addition, the control voltage generated by the control voltage generation circuit 60 is not applied to the other end of the variable capacitive element 56 or the other end of the variable capacitive element 57, and the other end of the variable capacitive element 56 and the other end of the variable capacitive element 57 are in an electrically floating state. Since the switch 13 is opened in the overdrive mode, the capacitance of a node (hereinafter, referred to as "node A"), to which the other end of the variable capacitive element 16 and the other end of the variable capacitive element 17 are connected, to the ground is composed of only a value of the capacitive element 15 and becomes smaller than that in a normal mode in which the switch 13 is closed. In addition, since the switch 53 is opened in the overdrive mode, the capacitance of a node (hereinafter, referred to as "node B"), to which the other end of the variable capacitive element 56 and the other end of the variable capacitive element 57 are connected, to the ground is composed of only a value of the capacitive element 55 and becomes smaller than that in a normal mode in which the switch 53 is closed. Accordingly, impedance between the node A and the ground becomes higher in the overdrive mode, and thus a fluctuation in the voltage of one end of the variable capacitive element 16 and a fluctuation in the voltage of one end of the variable capacitive element 17 are likely to be transmitted to the node A. In addition, impedance between the node B and the ground becomes higher in the overdrive mode, and thus a fluctuation in the voltage of one end of the variable capacitive element 56 and a fluctuation in the voltage of one end of the variable capacitive element 57 are likely to be transmitted to the node B. As a result, even when the resonator is strongly excited during an overdrive inspection, a potential difference between the both ends of each of the variable capacitive elements 16, 17, 56, and 57 can be further reduced. Thus, it is possible to reduce a concern that the variable capacitive elements 16, 17, 56, and 57 may be damaged in spite of their relatively low withstand pressure. Therefore, according to this embodiment, it is possible to realize the oscillator with higher reliability.

1-3. Third Embodiment

Figure 7:
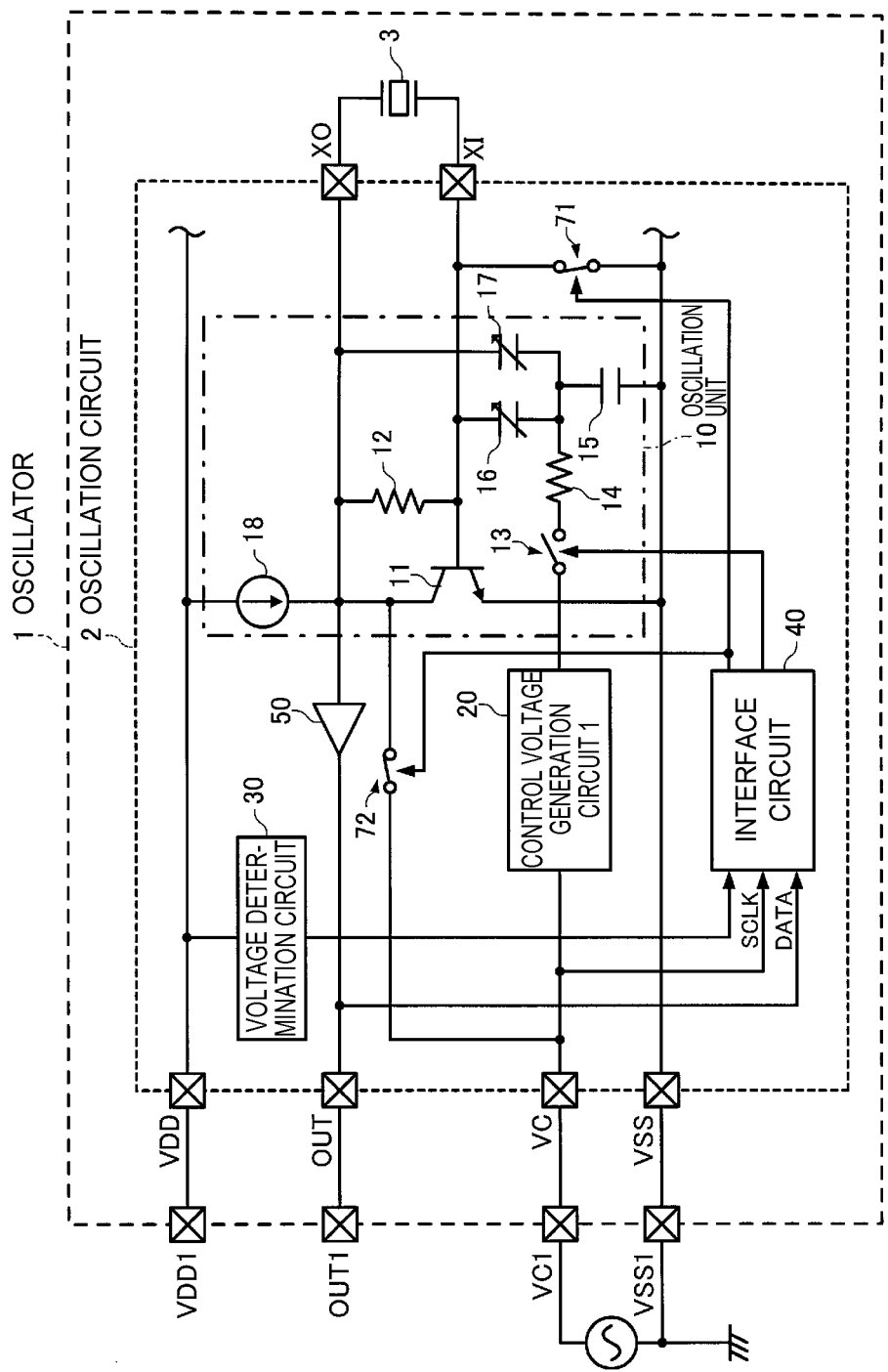
FIG. 7 is a functional block diagram of an oscillator according to a third embodiment.

FIG. 7 is a functional block diagram of an oscillator according to a third embodiment. In FIG. 7, components corresponding to the respective components of FIG. 3 are denoted by the same reference numerals and signs as those of FIG. 3.

As shown in FIG. 7, an oscillation circuit 2 in an oscillator 1 according to the third embodiment is further provided with a switch 71 and a switch 72 with respect to the first embodiment.

The switch 71 (example of a first switching unit) is connected between a terminal XI and a terminal VSS so as to be capable of limiting the magnitude of a signal which is supplied to the terminal VSS (example of a third terminal) from the terminal XI. For example, one end (one terminal) of the switch is connected to the terminal VSS, and the other end (the other terminal) thereof is connected to the terminal XI. The switch 71 controls the electrical connection between the terminal VSS and the terminal XI.

The switch 72 (example of a second switching unit) is connected between a terminal XO and a terminal VC so as to be capable of limiting the magnitude of a signal which is supplied to the terminal VC (example of a fourth terminal) from the terminal XO. For example, one end (one terminal) of the switch is connected to the terminal VC, and the other end (the other terminal) thereof is connected to the terminal XO. The switch 72 controls the electrical connection between the terminal VC and the terminal XO.

In this embodiment, the opening and closing of the switches 71 and 72 are controlled using a control signal (example of a switching signal) from an interface circuit 40. When the oscillation circuit 2 is set to be in a normal mode, both of the switches 71 and 72 are opened. When the oscillation circuit 2 is set to be in an overdrive mode, both of the switches 71 and 72 are closed.

In this embodiment, when the oscillation circuit 2 is set to be in an overdrive mode, a constant current source 18 is set to be in an invalid state, and thus it is possible to oscillate the resonator 3 using a current based on a voltage of a terminal VC1.

The other configurations of the oscillator 1 according to the third embodiment are the same as those in the first embodiment, and thus the description thereof will be omitted here. In addition, a perspective view, a cross-sectional view, a bottom view, and a manufacturing method of the oscillator 1 according to the third embodiment are the same as those in the first embodiment, and thus the illustration and description thereof will be omitted here. According to the oscillator of the third embodiment, the same effects as in the oscillator 1 according to the first embodiment are obtained.

Further, according to the oscillator of the third embodiment, it is possible to perform an overdrive inspection by inputting an AC signal of a high voltage to an external terminal VC1 by using, for example, a signal generator or an external oscillation circuit in a state where the oscillation circuit 2 is set to be in an overdrive mode and an external terminal VSS1 is connected to a ground. Alternatively, it is also possible to perform a drive level inspection by inputting an AC signal to the external terminal VC1 while changing the amplitude in a state where the oscillation circuit 2 is set to be in an overdrive mode and the external terminal VSS1 is connected to a ground.

In addition, according to the oscillator of the third embodiment, the external terminals VC1 and VSS1 can be shared during a normal operation of the oscillation circuit 2 and during an inspection of the resonator 3, and thus it is possible to reduce the number of terminals used for the inspection, as compared with a case where an inspection terminal exclusively for inspection is provided. Therefore, for example, it is possible to reduce the possibility of the occurrence of an inspection failure due to a defective electrical connection between a probe for inputting an inspection signal and a terminal on the oscillation circuit 2 side, and thus it is possible to realize the oscillation circuit 2 in which the reliability of the inspection of the resonator 3 is increased. In addition, it is possible to apply a voltage to both ends of the resonator 3 through the external terminals VC1 and VSS1 without using an oscillation unit 10, and thus the restrictions of a range of a voltage to be applied are reduced, as compared with a case where a voltage is applied to the resonator 3 through the oscillation unit 10.

In the oscillator according to the third embodiment, when the oscillation circuit 2 is set to be in an overdrive mode, the switch 71 is closed. Thus, an input terminal of the oscillation unit 10, that is, a base terminal of an NPN-type bipolar transistor 11 is connected to the external terminal VSS1 (terminal VSS). Accordingly, when an overdrive inspection or a drive level inspection is performed, the oscillation unit 10 does not operate by the base terminal of the bipolar transistor 11 being grounded, and thus it is possible to protect the oscillation circuit 2. As a result, the degree of freedom in design of the oscillation circuit is increased.

1-4. Fourth Embodiment

Figure 8:
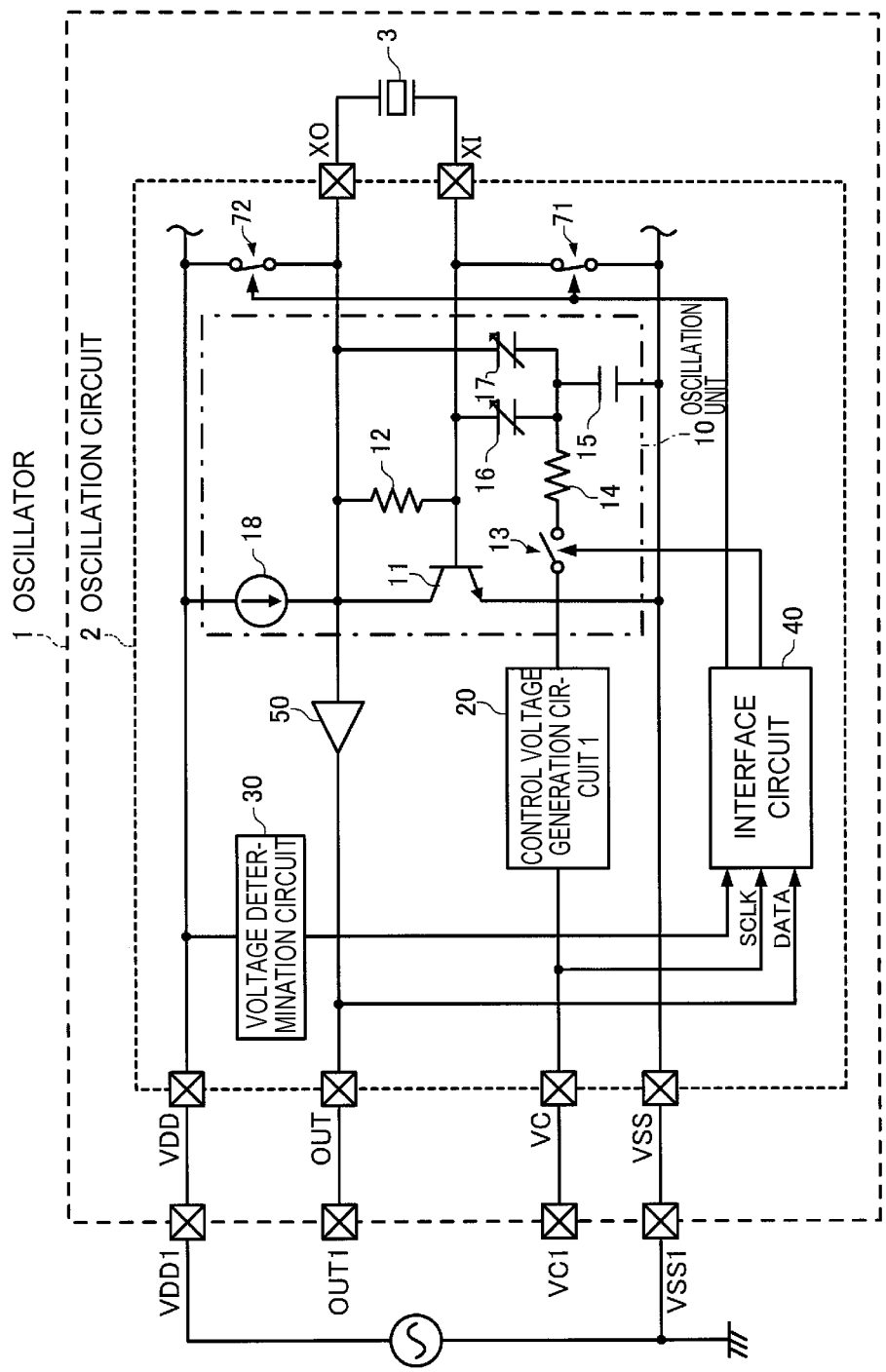
FIG. 8 is a functional block diagram of an oscillator according to a fourth embodiment.

FIG. 8 is a functional block diagram of an oscillator according to a fourth embodiment. In FIG. 8, components corresponding to the respective components of FIG. 7 are denoted by the same reference numerals and signs as those of FIG. 7.

As shown in FIG. 8, an oscillation circuit 2 in an oscillator 1 according to the fourth embodiment is different from that in the third embodiment in the connection of a switch 72.

The switch 72 (example of a second switching unit) is connected between a terminal XO and a terminal VDD so as to be capable of limiting the magnitude of a signal which is supplied to the terminal VDD (example of a fourth terminal) from the terminal XO. For example, one end (one terminal) of the switch is electrically connected to the terminal VDD, and the other end (the other terminal) thereof is electrically connected to the terminal XO. The switch 72 controls the electrical connection between the terminal VDD and the terminal XO.

In this embodiment, when the oscillation circuit 2 is set to be in an overdrive mode, a constant current source 18 is set to be in an invalid state so that the operation of an NPN-type bipolar transistor 11 is stopped, and an overdrive inspection may be performed by directly oscillating the resonator 3 using an amplitude of a current based on an AC voltage which is input to an external terminal VDD1 (terminal VDD).

The other configurations of the oscillator 1 according to the fourth embodiment are the same as those in the third embodiment, and thus the description thereof will be omitted here. In addition, a perspective view, a cross-sectional view, a bottom view, and a manufacturing method of the oscillator 1 according to the fourth embodiment are the same as those in the first embodiment, and thus the illustration and description thereof will be omitted here. According to the oscillator of the fourth embodiment, the same effects as in the oscillator 1 according to the first embodiment are obtained.

Further, according to the oscillator of the fourth embodiment, it is possible to perform an overdrive inspection by inputting an AC signal of a high voltage to an external terminal VDD1 by using, for example, a signal generator or an external oscillation circuit in a state where the oscillation circuit 2 is set to be in an overdrive mode and an external terminal VSS1 is connected to a ground. Alternatively, it is also possible to perform a drive level inspection by inputting an AC signal to the external terminal VDD1 while changing an amplitude in a state where the oscillation circuit 2 is set to be in an overdrive mode and the external terminal VSS1 is connected to a ground.

In addition, according to the oscillator of the fourth embodiment, the external terminals VDD1 and VSS1 can be shared during a normal operation of the oscillation circuit 2 and during an inspection of the resonator 3, and thus it is possible to reduce the number of terminals used for the inspection, as compared with a case where an inspection terminal exclusively for inspection is provided. Therefore, for example, it is possible to reduce the possibility of the occurrence of an inspection failure due to a defective electrical connection between a probe for inputting an inspection signal and a terminal on the oscillation circuit 2 side, and thus it is possible to realize the oscillation circuit 2 in which the reliability of the inspection of the resonator 3 is increased. In addition, it is possible to apply a voltage to both ends of the resonator 3 through the external terminals VDD1 and VSS1 without using an oscillation unit 10, and thus the restrictions of a range of a voltage to be applied are reduced, as compared with a case where a voltage is applied to the resonator 3 through the oscillation unit 10.

In the oscillator according to the fourth embodiment, when the oscillation circuit 2 is set to be in an overdrive mode, the switch 71 is closed. Thus, an input terminal of the oscillation unit 10, that is, a base terminal of an NPN-type bipolar transistor 11 is connected to the external terminal VSS1 (terminal VSS). Accordingly, when an overdrive inspection or a drive level inspection is performed, the oscillation unit 10 does not operate by the base terminal of the bipolar transistor 11 being grounded, and thus it is possible to protect the oscillation circuit 2. As a result, the degree of freedom in design of the oscillation circuit is increased.

1-5. Fifth Embodiment

Figure 9:
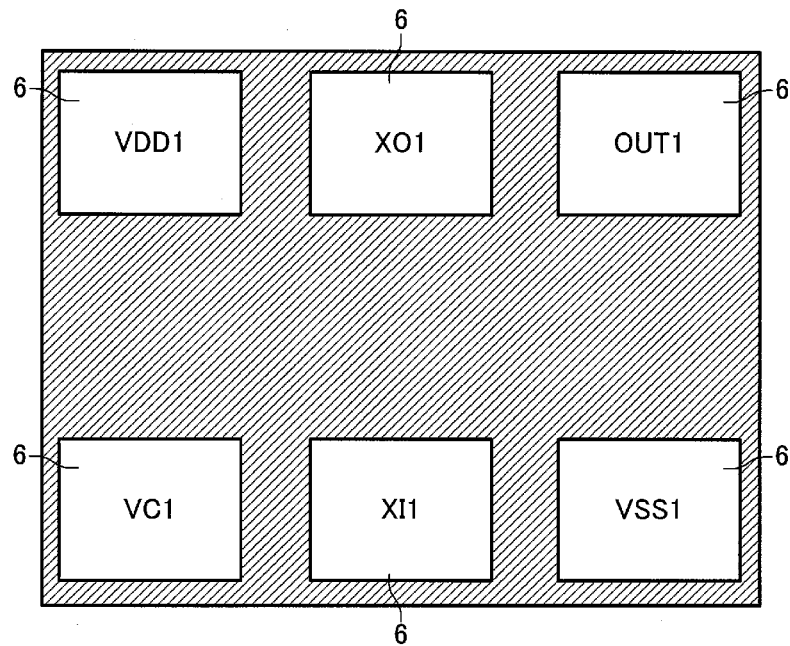
FIG. 9 is a bottom view of an oscillator according to a fifth embodiment.
Figure 10:
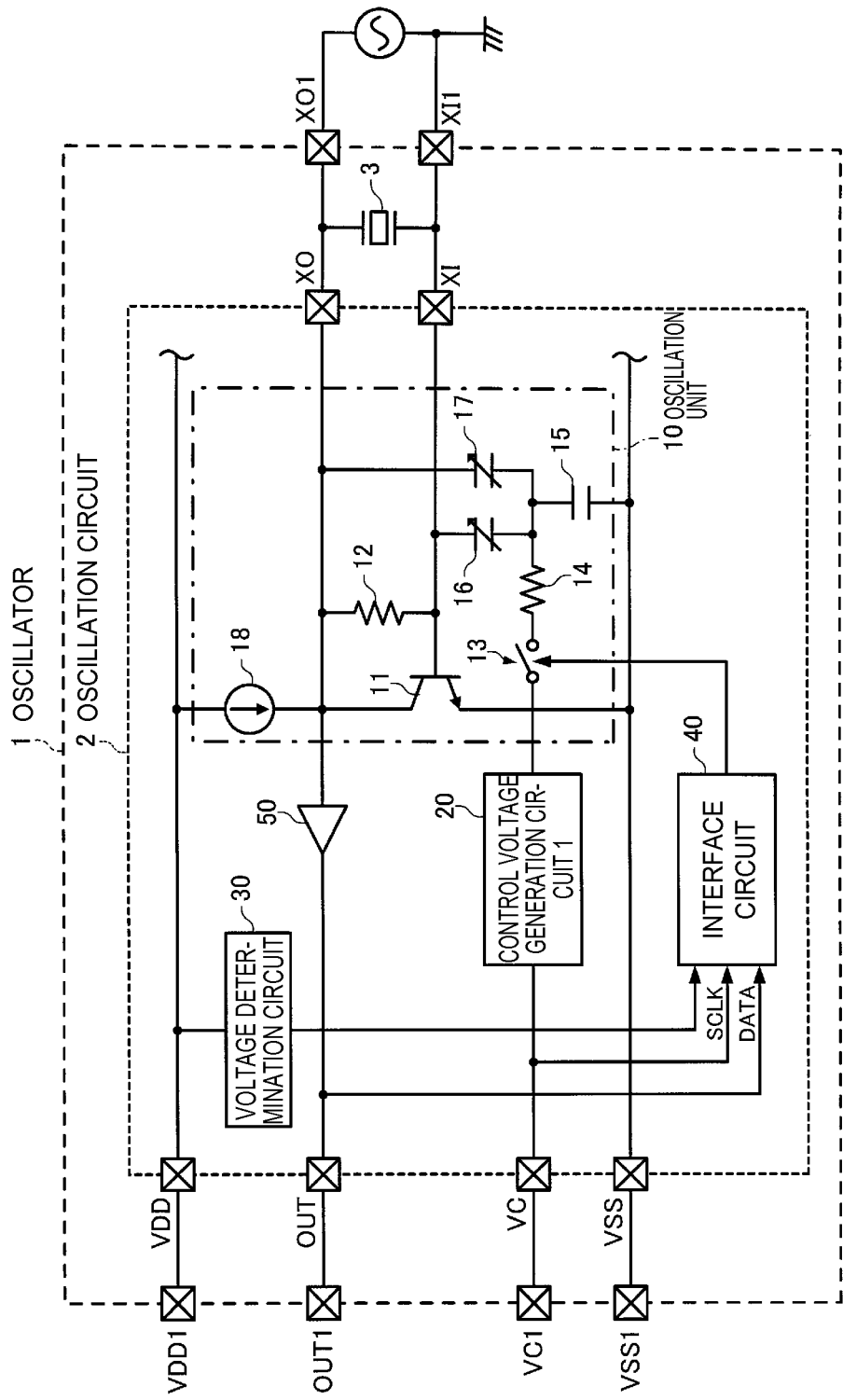
FIG. 10 is a functional block diagram of the oscillator according to the fifth embodiment.

FIG. 9 is a bottom view of an oscillator according to a fifth embodiment. In addition, FIG. 10 is a functional block diagram of the oscillator according to the fifth embodiment. In FIG. 10, components corresponding to the respective components of FIG. 3 are denoted by the same reference numerals and signs as those of FIG. 3.

As shown in FIGS. 9 and 10, an oscillator 1 according to the fifth embodiment is further provided with two external terminals XO1 and XI1 with respect to the first embodiment. The external terminal XO1 is connected to a terminal XO of an oscillation circuit 2, and the external terminal XI1 is connected to a terminal XI of the oscillation circuit 2.

In this embodiment, when the oscillation circuit 2 is set to be in an overdrive mode, a constant current source 18 is set to be in an invalid state, and thus it is possible to oscillate the resonator 3 using a current based on a voltage of a terminal XO1.

The other configurations of the oscillator 1 according to the fifth embodiment are the same as those in the first embodiment, and thus the description thereof will be omitted here. In addition, a perspective view, a cross-sectional view, and a manufacturing method of the oscillator 1 according to the fifth embodiment are the same as those in the first embodiment, and thus the illustration and description thereof will be omitted here. According to the oscillator of the fifth embodiment, the same effects as in the oscillator 1 according to the first embodiment are obtained.

Further, according to the oscillator of the fifth embodiment, it is possible to directly perform an overdrive inspection on the resonator 3 by inputting an AC signal of a high voltage to the external terminal XO1 by using, for example, a signal generator or an external oscillation circuit in a state where the oscillation circuit 2 is set to be in an overdrive mode and an external terminal XI1 is connected to a ground. Alternatively, it is also possible to directly perform a drive level inspection on the resonator 3 by inputting an AC signal to the external terminal XO1 while changing an amplitude in a state where the oscillation circuit 2 is set to be in an overdrive mode and the external terminal VSS1 is connected to a ground.

In the oscillator according to the fifth embodiment, when the oscillation circuit 2 is in an overdrive test mode, the external terminal XI1 is connected to a ground. Thus, an input terminal of an oscillation unit 10, that is, a base terminal of an NPN-type bipolar transistor 11 is connected to the external terminal VSS1 (terminal VSS). Accordingly, when an overdrive inspection or a drive level inspection is performed, the oscillation unit 10 does not operate by the base terminal of the bipolar transistor 11 being grounded, and thus it is possible to protect the oscillation circuit 2. As a result, the degree of freedom in design of the oscillation circuit is increased. Meanwhile, even in a state where the external terminal XI1 is not connected to a ground, it is possible to perform an overdrive inspection or a drive level inspection by applying an AC signal of a high voltage between the external terminal XI1 and the external terminal XO1 or by applying an AC signal between the external terminal XI1 and the external terminal XO1 while changing an amplitude.

1-6. Sixth Embodiment

Figure 11:
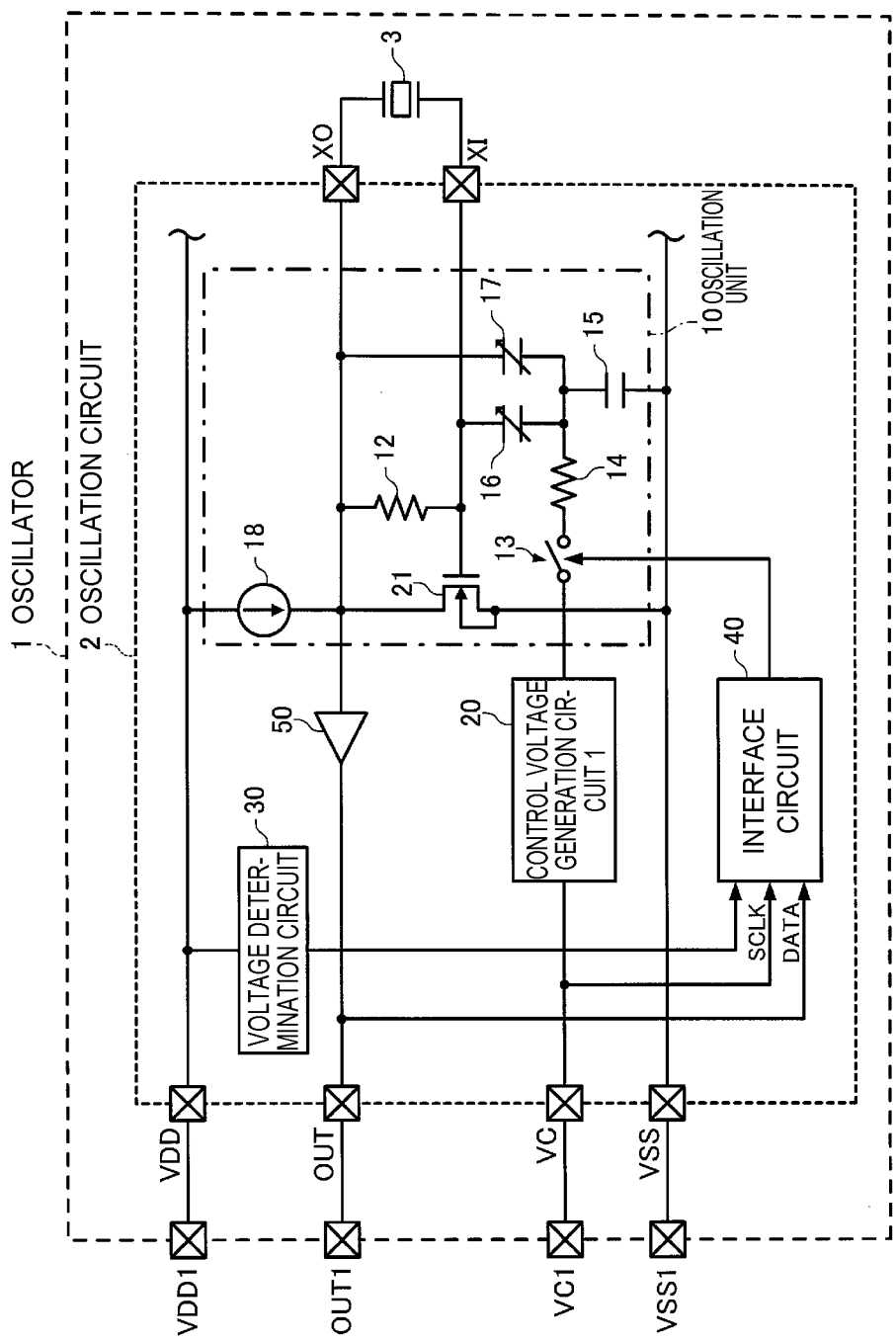
FIG. 11 is a functional block diagram of an oscillator according to a sixth embodiment.

FIG. 11 is a functional block diagram of an oscillator according to a sixth embodiment. In FIG. 11, components corresponding to the respective components of FIG. 3 are denoted by the same reference numerals and signs as those of FIG. 3.

As shown in FIG. 11, in an oscillation circuit 2 in an oscillator 1 according to the sixth embodiment, an NMOS transistor 21 is used as an amplification element of an oscillation unit 10 instead of a bipolar transistor 11, with respect to the first embodiment. In the NMOS transistor 21, a gate terminal, a source terminal, and a drain terminal are connected to a terminal XI, a terminal VSS, and a terminal XO, respectively. A signal of the drain terminal of the NMOS transistor 21 is a signal obtained by amplifying an output signal of a resonator 3 which is input to the gate terminal through the terminal XI, and is input to the resonator 3 through the terminal XO.

The other configurations of the oscillator 1 according to the sixth embodiment are the same as those in the first embodiment, and thus the description thereof will be omitted here. In addition, a perspective view, a cross-sectional view, and a manufacturing method of the oscillator 1 according to the sixth embodiment are the same as those in the first embodiment, and thus the illustration and description thereof will be omitted here. According to the oscillator of the sixth embodiment, the same effects as in the oscillator 1 according to the first embodiment are obtained.

1-7. Seventh Embodiment

Figure 12:
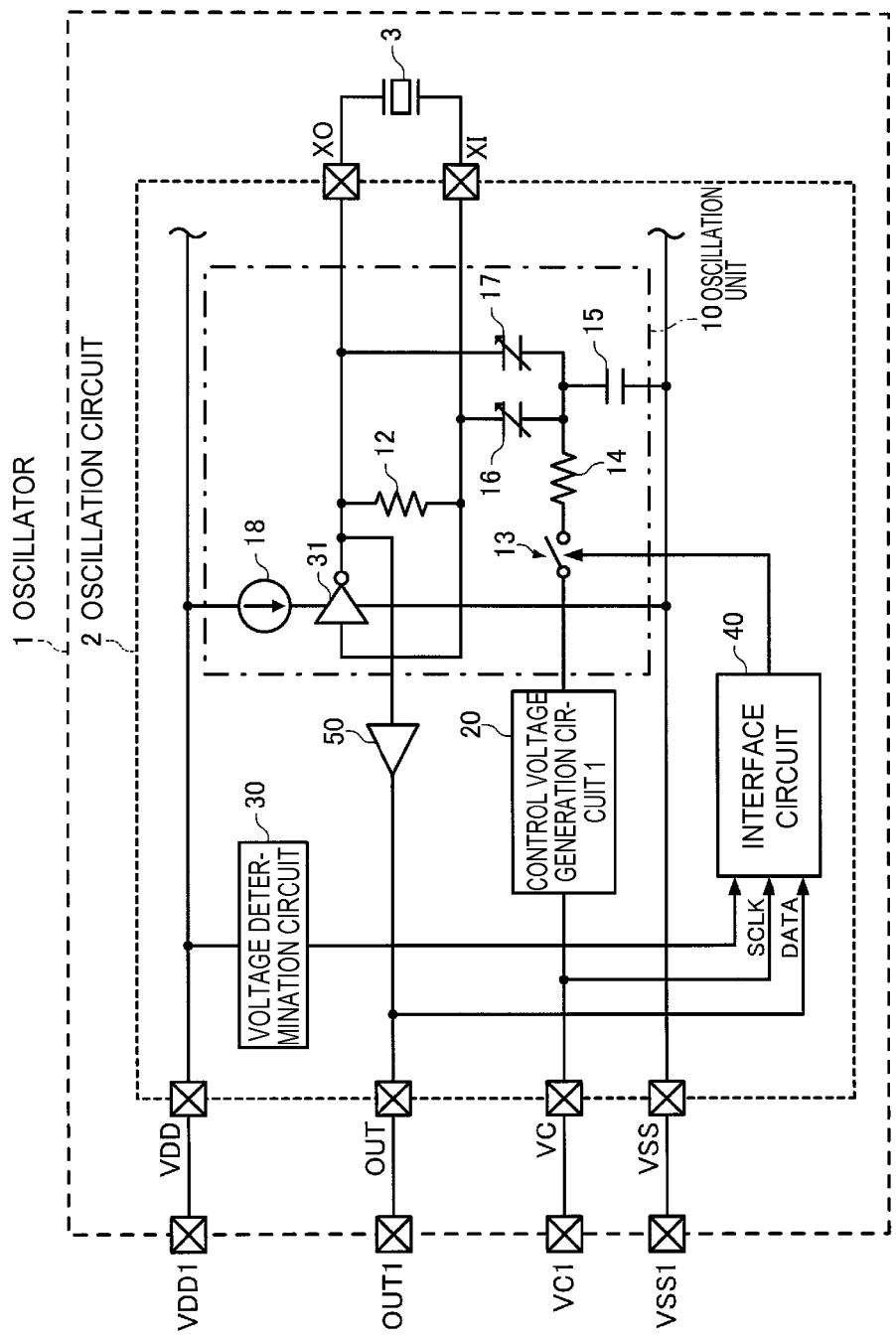
FIG. 12 is a functional block diagram of an oscillator according to a seventh embodiment.

FIG. 12 is a functional block diagram of an oscillator according to a seventh embodiment. In FIG. 12, components corresponding to the respective components of FIG. 3 are denoted by the same reference numerals and signs as those of FIG. 3.

As shown in FIG. 12, in an oscillation circuit 2 in an oscillator 1 according to the seventh embodiment, a CMOS inverter 31 is used as an amplification element of an oscillation unit 10 instead of a bipolar transistor 11, with respect to the first embodiment. In the CMOS inverter 31, an input terminal and an output terminal are connected to a terminal XI and a terminal XO, respectively. The CMOS inverter 31 amplifies and outputs an output signal of a resonator 3, which is input through the terminal XI, by reversing the polarity thereof, using a potential difference between a terminal VDD and a terminal VSS as a power supply voltage. An output signal of the CMOS inverter 31 is input to the resonator 3 through the terminal XO.

The other configurations of the oscillator 1 according to the seventh embodiment are the same as those in the first embodiment, and thus the description thereof will be omitted here. In addition, a perspective view, a cross-sectional view, and a manufacturing method of the oscillator 1 according to the seventh embodiment are the same as those in the first embodiment, and thus the illustration and description thereof will be omitted here. According to the oscillator of the seventh embodiment, the same effects as in the oscillator 1 according to the first embodiment are obtained.

2. Electronic Device

Figure 13:
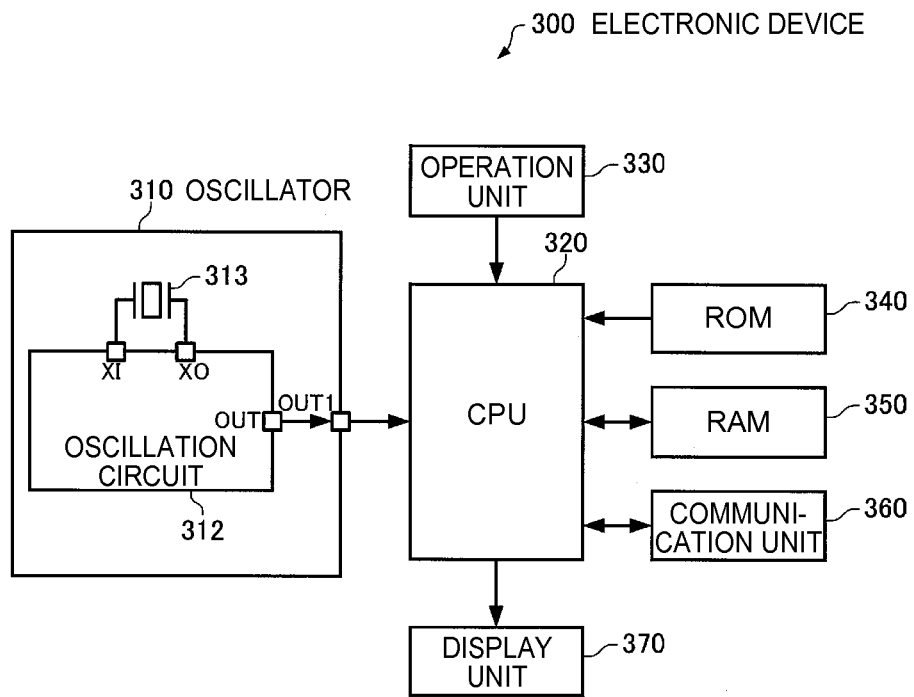
FIG. 13 is a functional block diagram of an electronic device according to this embodiment.
Figure 14:
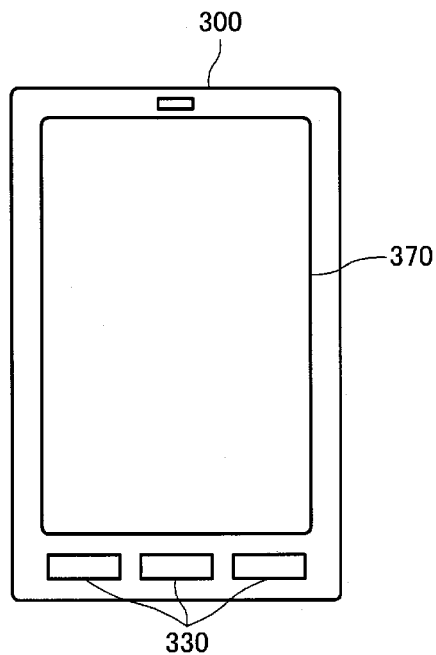
FIG. 14 is a diagram showing an example of an exterior of an electronic device according to this embodiment.

FIG. 13 is a functional block diagram of an electronic device according to this embodiment. In addition, FIG. 14 is a diagram showing an example of an exterior of a smartphone which is an example of the electronic device according to this embodiment.

An electronic device 300 according to this embodiment is configured to include an oscillator 310, a central processing unit (CPU) 320, an operation unit 330, a read only memory (ROM) 340, a random access memory (RAM) 350, a communication unit 360, and a display unit 370. Meanwhile, the electronic device according to this embodiment may have a configuration in which some of the components (respective units) of FIG. 13 are omitted or changed, or may have a configuration in which other components are added thereto.

The oscillator 310 includes an oscillation circuit 312 and a resonator 313. The oscillation circuit 312 generates a clock signal by oscillating the resonator 313 connected thereto through a terminal XI and a terminal XO, and outputs the generated clock signal from a terminal OUT. The clock signal is output to the CPU 320 from an external terminal OUT1 of the oscillator 310.

The CPU 320 performs various types of calculation processes and control processes in synchronization with the clock signal which is input from the oscillator 310, in accordance with a program stored in the ROM 340 or the like. Specifically, the CPU 320 performs various types of processes in response to an operation signal from the operation unit 330, a process of controlling the communication unit 360 in order to perform data communication with an external device, a process of transmitting a display signal for causing the display unit 370 to display various pieces of information, and the like.

The operation unit 330 is an input device constituted by operation keys, button switches or the like, and outputs an operation signal to the CPU 320 in response to a user's operation.

The ROM 340 stores programs, data, or the like for causing the CPU 320 to perform various types of calculation processes and control processes.

The RAM 350 is used as a work area of the CPU 320, and temporarily stores programs and data which are read out from the ROM 340, data which is input from the operation unit 330, computation results executed by the CPU 320 in accordance with various types of programs, and the like.

The communication unit 360 performs a variety of controls for establishing data communication between the CPU 320 and an external device.

The display unit 370 is a display device constituted by a liquid crystal display (LCD) or the like, and displays various pieces of information on the basis of a display signal which is input from the CPU 320. The display unit 370 may be provided with a touch panel functioning as the operation unit 330.

For example, the oscillation circuit 2 according to the above-described embodiment is applied as the oscillation circuit 312. Alternatively, for example, the oscillator 1 according to the above-described embodiment is applied as the oscillator 310. Thus, it is possible to realize the electronic device with high reliability.

Various electronic devices are considered as such an electronic device 300. For example, the electronic device includes a personal computer (for example, mobile-type personal computer, laptop personal computer, or tablet personal computer), a mobile terminal such as a smartphone or a cellular phone, a digital still camera, an ink jet ejecting apparatus (for example, ink jet printer), a storage area network device such as a router or a switch, a local area network device, a device for a mobile terminal base station, a television, a video camera, a video recorder, a car navigation device, a real-time clock device, a pager, an electronic notebook (also including a communication function), an electronic dictionary, an electronic calculator, an electronic game console, a game controller, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), a flight simulator, a head mounted display, a motion tracer, a motion tracker, a motion controller, PDR (walker position and direction measurement), and the like.

3. Moving Object

Figure 15:
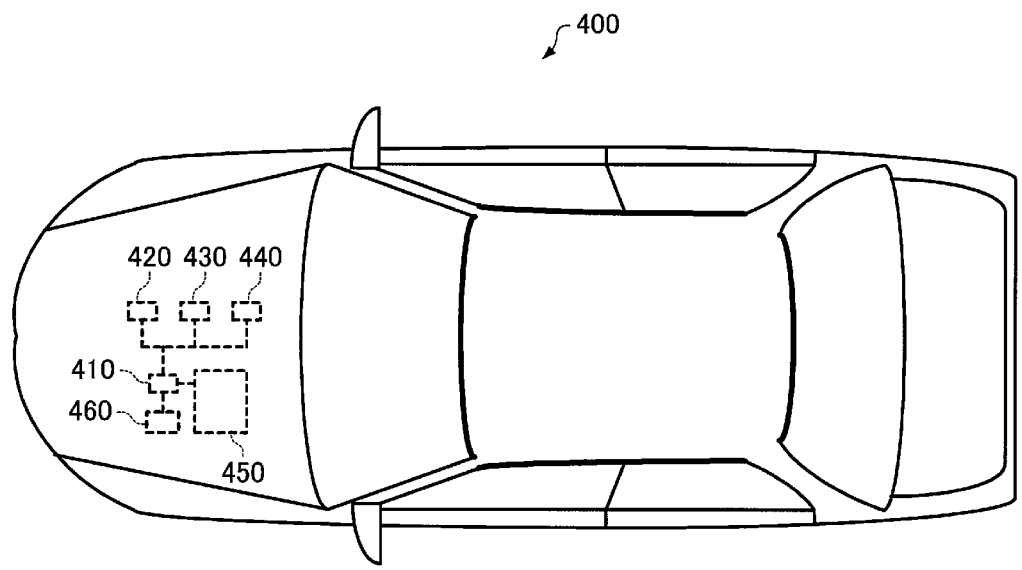
FIG. 15 is a diagram showing an example of a moving object according to this embodiment.

FIG. 15 is a diagram (top view) showing an example of a moving object according to this embodiment. A moving object 400 shown in FIG. 15 is configured to include an oscillator 410, controllers 420, 430, and 440 that perform a variety of controls of an engine system, a brake system, a keyless entry system and the like, a battery 450, and a backup battery 460. Meanwhile, the moving object according to this embodiment may have a configuration in which some of the components (respective units) of FIG. 15 are omitted, and may have a configuration in which other components are added thereto.

The oscillator 410 includes an oscillation circuit and a resonator which are not shown in the drawing. The oscillation circuit generates a clock signal by oscillating the resonator. The clock signal is output to the CPU controllers 420, 430, and 440 from an external terminal of the oscillator 410.

The battery 450 supplies power to the oscillator 410 and the controllers 420, 430, and 440. The backup battery 460 supplies power to the oscillator 410 and the controllers 420, 430, and 440 when an output voltage of the battery 450 is decreased further than a threshold value.

For example, the oscillation circuit 2 according to the above-described embodiment is applied as the oscillation circuit included in the oscillator 410. Alternatively, for example, the oscillator 1 according to the above-described embodiment is applied as the oscillator 410. Thus, it is possible to realize the moving object with high reliability.

Various moving objects are considered as such a moving object 400. The moving object includes, for example, an automobile (also including an electric automobile), an aircraft such as a jet engine airplane or a helicopter, a vessel, a rocket, a satellite, and the like.

4. Modification Example

The invention is not limited to this embodiment, and various modifications can be made within the scope of the invention.

Modification Example 1

Figure 16A:
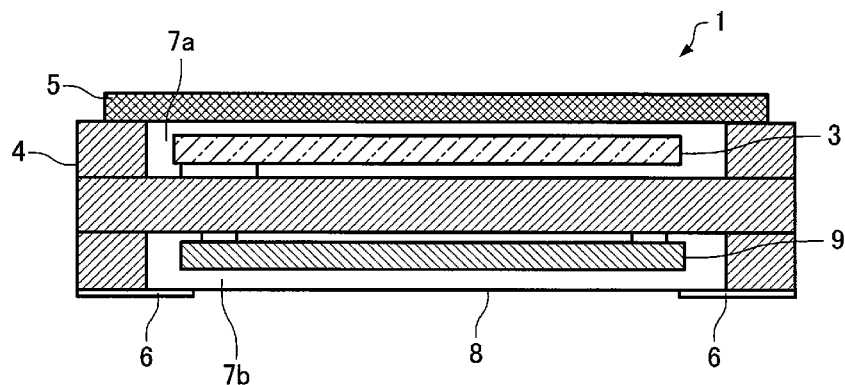
FIG. 16A is a cross-sectional view of an oscillator.
Figure 16B:
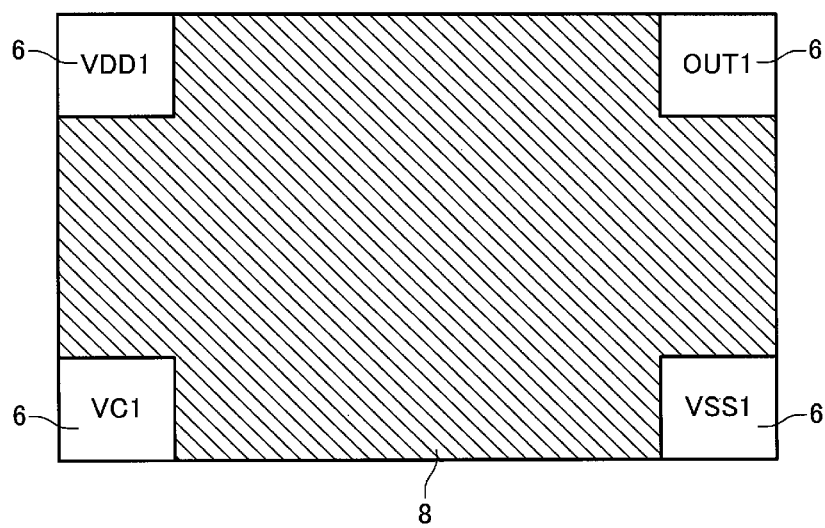
FIG. 16B is a bottom view of the oscillator.

For example, in the first to seventh embodiments described above, structures of a cross section and bottom of the oscillator 1 may be structures shown in FIGS. 16A and 16B, in addition to being structures shown in FIGS. 2A and 2B. A perspective view of the oscillator 1 according to this modification example is the same as that shown in FIG. 1, and FIG. 16A is a cross-sectional view taken along line A-A' of FIG. 1. In addition, FIG. 16B is a bottom view of an oscillator according to this modification example. As shown in FIGS. 16A and 16B, the oscillator 1 according to this modification example is configured to include the electronic component 9, the resonator 3, the package 4, the lid 5, the external terminal (external electrode) 6, and the sealing member 8 which constitute the oscillation circuit 2.

In the package 4, the electronic component 9 and the resonator 3 are accommodated in different spaces thereof. Specifically, two concave portions are provided in opposing surfaces in the package 4. An accommodation chamber 7a is formed by covering one concave portion with the lid 5, and an accommodation chamber 7b is formed by covering the other concave portion with the sealing member 8. The accommodation chamber 7a accommodates the resonator 3, and the accommodation chamber 7b accommodates the electronic component 9. The inside of the package 4 or the surface of the concave portion is provided with wiring, not shown in the drawing, for electrically connecting two terminals (terminal XO and terminal XI) of the oscillation circuit 2 to two terminals of the resonator 3, respectively. In addition, the inside of the package 4 and the surface of the concave portion are provided with wiring, not shown in the drawing, for electrically connecting the terminals of the oscillation circuit 2 to the corresponding external terminals 6, respectively.

As shown in FIG. 16B, the bottom of the oscillator 1 (rear surface of the package 4) according to this modification example is provided with four external terminals 6, that is, an external terminal VDD1 which is a power terminal, an external terminal VSS1 which is a ground terminal, an external terminal VC1 which is a control terminal, and an external terminal OUT1 which is an output terminal. A power supply voltage is supplied to the external terminal VDD1, and the external terminal VSS1 is grounded. A signal for controlling a frequency is input to the external terminal VC1, and an oscillation signal having a frequency being controlled is output from the external terminal OUT1.

The embodiments and modification examples described above are just examples, and are not limited thereto. For example, the embodiments and the modification examples can also be appropriately combined with each other.

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2013-225944, filed Oct. 30, 2013 is expressly incorporated by reference herein.

What is claimed is:

1. An oscillation circuit comprising:
a first terminal which is connected to one end of a resonator;
a second terminal which is connected to the other end of the resonator;
an oscillation unit which is electrically connected to the first terminal and the second terminal;
a first switch operable in a normal oscillation mode and an inspection mode, wherein a current applied for exciting the resonator is greater in the inspection mode than in the normal oscillation mode; and
a first voltage generation circuit, wherein:
the oscillation unit includes at least one first electronic element having one end which is electrically connected to the first terminal or the second terminal,
the first switch controls a voltage which is applied to the other end of the first electronic element,
in the normal oscillation mode, the first switch electrically couples the other end of the first electronic element and an output terminal of the first voltage generation circuit, and
in the inspection mode, the first switch electrically decouples the other end of the first electronic element from the output terminal of the first voltage generation circuit.

2. The oscillation circuit according to claim 1, wherein the first electronic element is a variable capacitive element.

3. The oscillation circuit according to claim 1, further comprising:
a second voltage generation circuit; and
a second switch, wherein the oscillation unit further includes at least one second electronic element having one end which is electrically connected to the first terminal or the second terminal, and wherein the second switch controls electrical connection between the other end of the second electronic element and an output terminal of the second voltage generation circuit.

4. The oscillation circuit according to claim 3, wherein the second electronic element is a variable capacitive element.

5. The oscillation circuit according to claim 1, wherein the oscillation unit includes a capacitive element having one end, which is electrically connected to the other end of the first electronic element, and the other end which is grounded.

6. The oscillation circuit according to claim 1, further comprising:

a third terminal which is grounded;

a fourth terminal which is electrically connected to the second terminal; and a first switching unit which electrically connects the first terminal to the third terminal under control of a switching signal.

7. The oscillation circuit according to claim 6, further comprising a second switching unit which electrically connects the second terminal to the fourth terminal under control of the switching signal.

8. The oscillation circuit according to claim 6, wherein the first terminal is connected to an input terminal side of the oscillation unit.

9. The oscillation circuit according to claim 1, wherein switching between the normal oscillation mode and the inspection mode is performed on the basis of a clock signal which is input during a period in which a power supply voltage to be supplied is equal to or greater than a reference value.

10. An oscillator comprising:

the oscillation circuit according to claim 1; and a resonator.

11. The oscillator according to claim 10, further comprising a package that accommodates the oscillation circuit and the resonator.

12. An electronic device comprising the oscillation circuit according to claim 1.

13. A moving object comprising the oscillation circuit according to claim 1.

* * * * *